US008669591B2

(12) United States Patent
Marino et al.

(10) Patent No.: US 8,669,591 B2
(45) Date of Patent: Mar. 11, 2014

(54) E-MODE HFET DEVICE

(75) Inventors: Fabio Alessio Marino, San Jose, CA (US); Paolo Menegoli, San Jose, CA (US)

(73) Assignee: Eta Semiconductor Inc., San Jose, CA (US)

(*) Notice: Subject to any disclaimer, the term of this patent is extended or adjusted under 35 U.S.C. 154(b) by 9 days.

(21) Appl. No.: 13/337,753

(22) Filed: Dec. 27, 2011

(65) Prior Publication Data
US 2013/0161698 A1    Jun. 27, 2013

(51) Int. Cl.
*H01L 29/66*    (2006.01)

(52) U.S. Cl.
USPC    257/194; 257/76; 257/E29.068; 257/E29.246

(58) Field of Classification Search
USPC ................................ 25/76, 194; 257/76, 194
See application file for complete search history.

(56) References Cited

U.S. PATENT DOCUMENTS

| | | | |
|---|---|---|---|
| 5,319,223 A | 6/1994 | Fujita et al. | |
| 7,217,960 B2* | 5/2007 | Ueno et al. | 257/103 |
| 7,528,423 B2* | 5/2009 | Ueno et al. | 257/189 |
| 7,544,963 B2* | 6/2009 | Saxler | 257/20 |
| 7,663,161 B2 | 2/2010 | Kaibara et al. | |
| 8,410,543 B2* | 4/2013 | Yanagi et al. | 257/325 |
| 2001/0032999 A1* | 10/2001 | Yoshida | 257/332 |
| 2006/0183274 A1* | 8/2006 | Carcia et al. | 438/149 |
| 2008/0296622 A1* | 12/2008 | Kiewra et al. | 257/194 |
| 2009/0058532 A1* | 3/2009 | Kikkawa et al. | 330/295 |
| 2009/0090971 A1* | 4/2009 | Chang et al. | 257/351 |
| 2010/0289079 A1* | 11/2010 | Chatty et al. | 257/347 |
| 2011/0024798 A1* | 2/2011 | Tamari et al. | 257/195 |
| 2011/0210377 A1* | 9/2011 | Haeberlen et al. | 257/194 |
| 2011/0212582 A1* | 9/2011 | Hong et al. | 438/172 |
| 2011/0241019 A1* | 10/2011 | Beach et al. | 257/76 |
| 2011/0248283 A1* | 10/2011 | Cao et al. | 257/76 |
| 2012/0274402 A1* | 11/2012 | Kocon | 330/277 |
| 2013/0102140 A1* | 4/2013 | Derluyn et al. | 438/586 |
| 2013/0112986 A1* | 5/2013 | Hsiung et al. | 257/76 |

FOREIGN PATENT DOCUMENTS

JP    20068-305816    * 12/2008

* cited by examiner

*Primary Examiner* — A. Sefer

(57) ABSTRACT

The present invention describes a transistor based on a Hetero junction FET structure, where the metal gate has been replaced by a stack formed by a highly doped compound semiconductor and an insulating layer in order to achieve enhancement mode operation and at the same time drastically reduce the gate current leakage. The combination of the insulating layer with a highly doped semiconductor allows the tuning of the threshold voltage of the device at the desired value by simply changing the composition of the semiconductor layer forming the gate region and/or its doping allowing a higher degree of freedom. In one of the embodiment, a back-barrier layer and a heavily doped threshold tuning layer are used to suppress Short Channel Effect phenomena and to adjust the threshold voltage of the device at the desired value. The present invention can be realized both with polar and non-polar (or semi-polar) materials.

20 Claims, 19 Drawing Sheets

E-MODE HFET DEVICE

BACKGROUND OF THE INVENTION

1. Field of the Invention

The present invention is in the field of semiconductor structures. The present invention is further in the field of semiconductor structures of transistor devices. The present invention further relates to the field of integrated devices and circuits. The implementation is not limited to a specific technology, and applies to either the invention as an individual component or to inclusion of the present invention within larger systems which may be combined into larger integrated circuits.

2. Brief Description of Related Art

The semiconductor transistor is the most important component for large integrated circuits. In the last three decades, field effect transistors (FETs) used in current integrated circuit process technologies have undergone a continuous shrinking of the semiconductor area needed for elementary components, and new materials including III-V and II-VI semiconductor compounds have been introduced to improve the device performance. However the need to further improve its general performance while reducing its cost is still a necessity that poses a significant challenge.

In particular, the demand for high bit rate communication, millimeter wave applications and high frequency power conversion requires the development of devices with high cut-off frequencies and low specific $R_{DSon}$ (measured in $\Omega*mm^2$). The semiconductor area is directly proportional to the cost of the integrated circuit and a low on-resistance is always desirable to increase the efficiency of the circuit and to reduce the power dissipation and therefore the temperature of the chip. Furthermore, a lower specific on-resistance allows the fabrication of devices with smaller gate capacitance and therefore better RF performance.

One of the main candidates for these applications is the High Electron Mobility Transistors (HEMTs), which generally uses III-V compounds semiconductor materials, such as InAs (indium arsenide), GaAs (gallium arsenide), AlAs (aluminum arsenide) and their alloys (InGaAs and InAlAs) on InP substrate, or III-V Nitride materials such as AN (aluminum nitride), GaN (gallium nitride), InN (indium nitride) and their alloys (AlGaN, InGaN and InAlN). At the present time, very high cut-off frequencies $f_T$ have been obtained with these devices.

An example of High electron mobility transistor (HEMT), also known as hetero-structure FET (HFET), is reported in Fujita et al. (U.S. Pat. No. 5,319,223). This device is a field effect transistor incorporating a junction between two materials with different band-gaps (i.e., a hetero-junction) used as channel instead of a doped region as in MOSFET devices. HEMTs avoid impurity scattering through the use of high mobility electrons generated using the hetero junction of a highly-doped wide-band-gap n-type donor-supply layer (e.g. AlGaAs) and a non-doped narrow-band-gap channel layer with no dopant impurities (e.g. GaAs). The electrons generated in the thin n-type wide-band-gap layer drop completely into the narrow-band-gap layer where they are free to move without being affected by impurity scattering. This method to create an electron channel is called modulation doping.

The use of InAs, InAlAs, GaAs and InGaAs materials rather than Si (Silicon) provides two significant advantages. First of all, the room temperature mobility is more than 5 times larger, while the saturation velocity is about twice that of silicon. Second, it is possible to fabricate semi-insulating (SI) GaAs substrates which eliminate the problem of absorbing microwave power in the substrate due to free carrier absorption.

Most of Nitride semiconductors are wide gap semiconductors. For example, GaN and AN exhibit band-gaps of 3.4 eV and 6.2 eV, respectively, at ambient temperature. An advantage of nitride semiconductors is that they have a larger insulation breakdown electric field and a greater electron saturation drift speed than semiconductors such as GaAs or Si. The properties of large band-gap materials (such as GaN) make them ideally suited to operation at elevated temperatures, because they become intrinsic at much higher temperature than narrow band-gap materials, and sustain high current or voltage levels, since they exhibit a high breakdown field.

Furthermore, AlGaN/GaN hetero-structures do not require modulation doping, which is necessary in GaAs-based devices to create the electron gas at the hetero-interface. The discontinuity of the spontaneous polarization, due to the lack of symmetry in wurtzite crystals, induces free carriers at the interface. In addition, the piezoelectric polarization, due to the strain of the AlGaN layer, plays an important role in increasing the density of carriers in the device channel. In general, semiconductor materials with such polarization properties are referred as polar materials. High-power operation has been achieved by GaN based HEMTs in the millimeter wave frequency range.

In FIG. 1 a cross-sectional view of a known hetero-structure field effect transistor is depicted. In this structure, a Channel narrow band-gap layer 3, e.g. GaAs or GaN, and an n-type Barrier layer 5 with a wide band-gap, e.g. AlGaAs or AlGaN, are formed in this order over a substrate 4, e.g. semi-insulating GaAs or sapphire. A source electrode 6 and a drain electrode 2 are formed above the n-type layer 5 with a metal layer deposition. A gate electrode 1 is formed of metallic or semiconductor materials so as to be located between the source electrode 6 and the drain electrode 2. This field-effect transistor is usually a normally ON type FET in which a drain current flows when a 0V voltage is applied to the gate, due to the high-concentration two dimensional electron gas generated at the hetero-interface between the n-type AlGaAs (or AlGaN) layer 5 and the un-doped GaAs (or GaN) layer 3.

In order to improve its high-frequency performance, the gate length $L_G$ of the device has to be reduced. The Lg reduction allows the minimization of the parasitic capacitances associated with the device. This condition is essential for the improvement of RF performance. However, the reduction of Lg alone does not lead to maximum RF performance. The so-called "short channel effects" involve a shift of the threshold voltage and a deterioration of the transconductance and of the output conductance.

In order to avoid these effects in HEMT devices, the proper layer design must have a high aspect ratio Lg/α where α is the distance between the gate electrode and the two-dimensional electron gas. This scaling down rule involves a limit for HEMT structures due to the gate tunnel current and the degradation of the effective gate length related to the depletion in the recessed regions. In order to increase $f_T$ and $f_{max}$ it is therefore necessary to find alternative solutions so as to improve the actual technology.

Another important limitation of these structures is the difficulty to make them operate in enhancement mode. In case of non-polar or semi-polar materials, such as GaAs (or non polar or semi-polar III-Nitride materials), an enhancement mode device can be obtained removing the n-doping from the barrier layer region underneath the control terminal through the formation of a recessed gate. In FIG. 2 a cross-sectional view of a known enhancement mode hetero-structure field effect transistor employing GaAs and AlGaAs semiconductor materials is depicted. In this structure, delta doping regions 15 and 11 are used to supply carriers to the channel. As it can be seen, the gate has been recessed into the barrier layer 12 in order to remove the modulation doping of the channel under the control terminal 8, and raise the threshold voltage at positive values. A similar result could be obtained also by using two highly doped regions instead of the delta doping profiles.

The enhancement behavior of the previous structure has also another disadvantage: in order to isolate the source and the drain terminals from the gate, the gate region must be made smaller than the etched region formed in the barrier layer, leaving two isolating regions 9 and 7 at the sides of the gate. This causes a discontinuity in the doping modulation of the channel, adding two extra resistive paths in the channel.

HEMT employing polar materials such as GaN and III-Nitride alloys oriented along the [0001] direction, present similar limitations. In these devices, the channel carrier density is a consequence of the polarization discontinuity between the AlGaN (or AN) barrier and the GaN buffer layer, and cannot be removed by simply recessing the gate. A solution to this problem has been proposed in Ueno et al. (U.S. Pat. No. 7,528,423) where an insulating layer has been inserted between the metal gate electrode and the barrier layer, so that an improvement in the device transconductance and a reduction in the gate leakage current can be achieved.

The solution proposed by Ueno et al. however, requires a very thin barrier layer with very low Al concentrations in order to achieve positive threshold voltage values. This is due to the lack of stable metal alloys with high work-function to be used as gate electrode. This solution therefore degrades the carrier confinement in the GaN channel layer and is very susceptible to process variations. Furthermore the maximum threshold voltage achievable is of the order of few mV.

Another interesting solution for this problem is illustrated in FIG. 3 and was proposed by Kaibara et al. (U.S. Pat. No. 7,663,161). More in particular, as a potential structure for realizing the normally-off type FET, a HFET structure was proposed in which a p-type GaN layer 17, formed on the top of a barrier layer of un-doped AlGaN 21, was used as a gate for the device. The proposed device included also a channel layer of un-doped GaN 19 under the AlGaN barrier 21, where the electron channel is formed.

In this structure, the piezoelectric polarization, generated at the hetero-interface between the GaN channel layer 19 and the AlGaN barrier layer 21, is offset by the piezoelectric polarization generated at the hetero-interface between the AlGaN barrier layer and the GaN control layer 17. As a result, the concentration of two-dimensional electron gas (2DEG) below the GaN control layer is selectively reduced. The use of a p-doped gate further lowers the Fermi energy into the channel thereby achieving the normally-off characteristic.

The solution proposed by Ueno et al., even if very efficient in order to obtain an enhancement mode GaN device, still does not solve the problem associated with the parasitic gate diode that can turn on at moderate low positive gate voltages limiting the electron enhancement in the channel portion under the gate. If the gate voltage is brought to high enough voltage values, an injection of low mobility holes in the channel allows an increase of the electron population. However, if holes are injected into the channel, their recombination time limits the switching speed of the device deteriorating the overall device performance.

Furthermore, in general p-type dopant in compound semiconductor are not easy to deal with respect to n-type ones. For example, in III-N semiconductors the p-doping process is complicated by the following effects: large thermal activation energy of 120-200 meV which requires high annealing temperatures, hydrogen passivation of MOCVD-grown GaN-acceptor bounds, and significant acceptor reactor memory leading to broad dopant profiles.

There is therefore a need for a new device structure which can operate in normally-off conditions, without presenting strong limitations on the gate bias, with a threshold voltage easily tunable at the desired value and, at the same time, a reduced gate leakage current.

Although the cited prior art references describe structures that offer some of the described advantages, no one device includes all of them, limiting their ability to solve the problem of obtaining transistors with high RF performance, low power dissipation and low on-resistance per given semiconductor area in integrated circuits.

It is therefore a purpose of the present invention to describe a novel structure of a semiconductor transistor that offers the advantage of improved performances in terms of on-resistance and power consumption combined with a drastically reduction of the gate leakage current and a easily tunable threshold voltage.

SUMMARY OF THE INVENTION

The present invention describes a transistor based on a Hetero junction FET structure, where the metal gate has been replaced by a stack formed by a highly doped compound semiconductor and an insulating layer in order to achieve enhancement mode operation and at the same time drastically reduce the gate current leakage. The combination of the insulating layer with a highly doped semiconductor allows the tuning of the threshold voltage of the device at the desired value by simply changing the composition of the semiconductor layer forming the gate region and/or its doping obtaining an extremely high degree of freedom. The present invention can be realized both with polar and non-polar (or semi-polar) materials. In one of the embodiment, a back-barrier layer and a heavily doped threshold tuning layer are used to suppress Short Channel Effect phenomena and to adjust the threshold voltage of the device at the desired value. The present invention can be realized both with polar and non-polar (or semi-polar) materials.

In order to better understand the main concept of the present invention, let us consider the HFET structure illustrated in FIG. 4, which represents the preferred embodiment of the invention. As it can be seen, conventional device regions (source, gate and drain) are present. However, differently from a standard HEMT device, the gate region is formed with a highly doped semiconductor layer 23 deposited on the top of an insulating layer 24, instead of a Schottky contact or a pn junction.

This configuration offers many advantages with respect to traditional HEMT device structure. The semiconductor forming the gate layer, that preferably have a crystalline or polycrystalline structure, allows the easy adjustment of the threshold voltage to the desired value. In particular, if an alloy compound semiconductor material is employed, the threshold voltage can be varied by simply changing the molar fraction of the elements composing the compound material, allowing an extremely wide range of work-function values. This is a great advantage with respect to metal gates, which instead present a limited spectrum of work-functions and/or a series of integration and processing problems.

The insulating layer allows the reduction of the gate leakage current by more than two order of magnitude and at the same time eliminates the limitations on the doping type and/or material used for the gate region. In the proposed structure, the parasitic diode has been eliminated allowing also for the use of n-doped materials for the gate region. This is an important advantage, since, in general, n-type dopant in compound semiconductor are much easier to deal with respect to p-type ones. For example, in III-N semiconductors the p-doping process is complicated by the following effects: large thermal activation energy of 120-200 meV which requires high annealing temperatures, hydrogen passivation of MOCVD-grown GaN-acceptor bounds, and significant acceptor reactor memory leading to broad dopant profiles. Furthermore, since the presence of the insulating layer, the choice of the semiconductor material and its thickness are not anymore limited by the need to obtain a lattice matched structure.

The source and drain regions 28 and 25 can be extended down into the channel as shown in FIG. 4 in order to minimize the contact resistance of the device, or they can be limited into (or on top of) the barrier layer. They can be realized in metal or with the same material of the channel (or barrier) region and heavily doped in order to decrease the contact resistivity. The barrier layer and the channel layer can be left un-doped or can be doped with n- or p-type impurities in order to tune the threshold voltage. Furthermore, the gate-insulating stack can be also formed in a recessed region, similarly to what has been done for the metallic gate 8 in FIG. 2, in order to reduce the distance between the gate and the device channel, thereby increasing the device transconductance.

The novel device can be manufactured using both polar or/and non-polar or semi-polar semiconductor materials. An implementation example of the described embodiment is illustrated in FIG. 5, where an AlGaAs barrier 32 and a GaAs channel layer 34 have been used. A δ-doping implant 37 has been introduced into the barrier layer in order to supply carriers to the device channel. A heavily p-doped AlGaAs layer 30 has been used as a gate region in order to obtain an enhancement mode device. As well known to anyone skilled in the art, also GaAs, InGaAs, InAs, or InAlAs can be used in place of AlGaAs for the gate region obtaining similar results. If desired, the gate-insulating stack can be also formed in a recessed region, similarly to what has been done for the metallic gate 8 in FIG. 2, in order to selectively remove the δ-doping under the gate and further rise the threshold voltage of the device.

When polar materials are utilized, an enhancement mode device can be easily obtained by using a p-doped III-N semiconductor gate, as depicted in FIG. 6. In this structure, the polarization generated at the hetero-interface between the channel layer 41 and the barrier layer 44 is partially (or totally) offset by the polarization generated at the hetero-interface between the barrier layer 44 and the insulating layer 39 summed to the polarization charge eventually generated at the lower interface of the gate region. As a result, the concentration of two-dimensional electron gas (2DEG) below the GaN control layer is selectively reduced. The use of a heavily p-doped gate further lowers the Fermi energy into the channel thereby achieving the normally-off characteristic. The gate region can be fabricated for example with GaN, InN, AN or one of their alloys. The smaller is the band-gap of the material used and the higher is the p-doping activation, lowering the gate resistance of the device.

As mentioned above, also n-doped semiconductor materials can be used for the gate region. An example is showed in FIG. 7, where the gate 47 has been fabricated with a heavily n-doped InN layer. Due to the high electron affinity of this material, the device still behaves as an enhancement mode device even if no p-doped layer is present. Similar results can be also obtained using an InGaN layer. This characteristic is extremely important since n-dopant impurities allow the drastic reduction of the gate resistance and increase of the device transconductance with respect to p-dopant impurities, improving the overall device performance. Furthermore, as mentioned above, the use of donor-type impurities allows an improvement in the fabrication process.

In FIG. 8 the I-V characteristics resulting by the numerical simulation of the devices according to embodiment of FIG. 6 (dashed lines 53) and FIG. 7 (solid lines 52) are shown. As it can be seen, both devices have an enhancement behavior. In particular, the embodiment of FIG. 6 with a p+-doped AlGaN gate shows a threshold voltage around 2V, whereas the embodiment of FIG. 7 with the InN n+-doped gate shows a threshold voltage around 0.9V.

In order to minimize short channel effects, such as Drain induced barrier lowering and Punch-through phenomena, a buried back-barrier layer can be added to the structure, so as to effectively improve the carrier confinement in the device channel. This approach is illustrated in FIG. 9, where an extra barrier 57 has been added under the channel 60. The back-barrier layer can be made for example with a semiconductor material having a larger energy-gap with respect to the channel (e.g. AlGaAs, InAlAs or AlAs for a GaAs channel, AlGaN, AN or InAlN for a GaN channel) or with a heavily doped layer made of the same material of the channel region.

If polar materials are used, a back-barrier layer with a smaller energy-gap with respect to the channel region (such as InGaN for a GaN channel layer) can be also used, exploiting the polarization in the extra layer to confine the carriers into the channel. In general, the back-barrier layer can be left intrinsic or can be doped (also heavily) in order to increase the carrier confinement into the channel and/or tune the threshold voltage.

The back-barrier layer of FIG. 9 can be also replaced with a double back-barrier layer, where a first intrinsic layer (e.g. AlGaN, InAlN, or AN) is used to increase the back-barrier high, and a second heavily doped layer (e.g. GaN, InAlN or AlGaN) is used to adjust the threshold voltage of the device.

A more general approach of this concept is shown in FIG. 10, where under the back-barrier layer 66, a heavily doped threshold tune layer 70 has been added in order to tune the threshold voltage of the device at the desired value. As shown in figure, the extra layer 70 can be spaced from the back-barrier layer 66 in order to reduce the remote impurity scattering in the channel.

If polar III-N semiconductor materials are used, the present invention can be realized also with a N-face configuration. In this case the polarization vectors in all material layers are flipped over with respect to the more standard Ga-face configurations discussed above. An example of embodiment in N-face configuration is illustrated in FIG. 11. In this case the electronic channel is formed in the lower part of the channel layer 83, allowing for a natural back-barrier configuration which improves the carriers confinement into the channel layer 83.

Due to the presence of the heavily doped gate layer 74 and the insulating layer 75, with this structure normally-off configurations can be obtained without adding any extra layer between the channel 83 and the gate insulating layer 75. If needed however, one or more threshold tuning layers, which can be formed for example by doped or undoped AN or AlGaN, can be added under the insulating layer as shown in FIG. 12. The negative polarization at the lower interface of the extra layer (and/or its doping) can further deplete the channel, thereby increasing the threshold voltage.

Another interesting embodiment of the present invention is shown in FIG. 13, where two highly n-doped regions 102 and 96 have been added above the barrier layer 100 into the access regions. These extra regions partially (or totally) compensate the polarization charge at the upper interface of the barrier layer 100 increasing the carrier concentration into the channel layer 98, thereby reducing the access resistance of the device.

As shown in FIG. 14, the present invention can be applied also to MOS-HEMT hybrid structures where the conduction under the gate is obtained by inverting the conductivity type of the material under the insulating layer 104.

Similarly, a MOSFET like structure can be obtained as shown in FIG. 15. In this case, a back-barrier layer 118 has been added to increase the carrier confinement into the channel as discussed above. As in all the other structures described in this document, the back-barrier layer is suggested but not essential to the working principle of the device. Furthermore, also in this case the back-barrier layer can be intrinsic or heavily doped, and/or can be used in combination with a heavily doped threshold tuning layer.

Another embodiment of the present invention is shown in FIG. 16. In this case, the drain and source regions 128 and 123 have been self-aligned with the barrier layer. This configuration does not have access regions, thereby the carriers travel directly from/to the source/drain terminal to/from the modulated channel-region under the gate. This characteristic leads to another important consequence, i.e. there is no need to form delta doping implants (at least in an enhanced mode device), or a recessed gate, since the only barrier region left is the one underneath the gate region. Furthermore, the dispersion phenomena are practically eliminated, since trapping and de-trapping phenomena are usually associated with the access regions of the device.

Also in this case, as in the previous embodiments, source and drain regions can be fabricated with n+semiconductor or metallic materials. These regions can be obtained through an implantation process step or by etching the barrier layer 122 and sub-sequentially depositing metal or depositing/growing doped semiconductor in the grooves created. In this second case, the source and drain regions can be realized also with the same material of the channel region in order to decrease the contact resistivity. They can be extended down into the channel or formed in the barrier layer. Furthermore, if desired, they can be extended down to the back-barrier layer (if this is present).

One lightly n-doped region can be also added at the edge of the drain region in order to minimize the electric field in the device. In this case the lightly doped region operates as drift-region for the HFET device.

Due to the peculiar structure of the device, the barrier layer 122 and the insulating layer 121 may be made wider than the gate region 120 so as to partially overlap the source and drain regions 128 and 123 or can be self-aligned with the gate region 120, so as to reduce the number of process masks required in the device fabrication process.

The barrier layer 122 can be also replaced with a stack of different layers of different materials and/or doped with different impurity types or concentrations and/or different alignment, in order to improve the device performance. Another possibility is to use different molar fraction for the different barrier layers. The back-barrier layer can be intrinsic or heavily doped, and/or can be used in combination with a heavily doped threshold tuning layer.

In the last two embodiments, since the device does not present access regions, the use of a heavily doped layer as (or in combination with) a back barrier presents many advantages. Aside from increasing the carrier confinement into the channel, this extra layer allows adjusting the threshold voltage of the device at the desired value regardless of the structure chosen for the device gate (schottky metal gate, metal/insulator stack gate, highly doped semiconductor gate or highly doped insulated gate).

With this technique, an enhancement mode device can be obtained also utilizing for example a Schottky gate or an insulated metal gate. Differently from the case where a highly doped layer is used as a gate region (insulated or not), the resistivity of this extra layer does not influence the device performance completely overcoming the issues related to the use of p-dopants in III-V materials in order to obtain enhancement mode devices.

The combination of a heavily doped layer utilized as (or in combination with) a back barrier and a highly doped insulated gate allows therefore an extremely high degree of freedom in the device engineering, which opens the possibility to obtain extremely high performance enhancement mode device.

Starting from the previous embodiment, as in all the device configurations described in this document, an N-face configuration can be obtained as depicted in FIG. 17. In this embodiment a second channel can form at the upper interface of the channel layer 138 allowing an increase of the device performance. Also in this structure, as in the embodiment of FIG. 12, one or more threshold tuning layers can be added between the insulating layer 130 and the channel 138 in order to increase the threshold voltage of the device. Furthermore, also in this case, the use of a heavily doped layer as (or in combination with the) back-barrier layer allows the fabrication of enhancement mode devices regardless of the structure utilized for the gate of the device.

As shown in FIG. 18, the present invention can be also fabricated with a multi-gate configuration, where an extra gate 143 has been added under the buried barrier layer 142 in order to improve the device performance. The two gates 139 and 143 can be coupled together or biased differently, one from the other, depending on the application. Many other multi-gate configurations can be obtained starting from the basic concept illustrated in FIG. 18. If the channel region 147 is formed thin enough, the two channels at the upper and lower interface can also merge in a single electron (or hole)—channel, further increasing the control of the carrier transport. The $R_{DSon}$ of the device is much lower with respect to conventional HEMT devices, (with respect to what?)due to the enhanced current drive derived from the double channel configuration. Furthermore, if necessary, one or both gate layers 139 and 143 can be divided in more layers of different materials in order to improve the device performance.

As known to anyone skilled in the art, many doping profiles and layers can be added to the structures described above in order to improve the device design and the channel density. For example, the barrier layer can be replaced with a stack of different layers of different materials (and/or doped with different impurity types or concentrations) in order to improve the device performance. Another possibility is to use different molar fraction for the different barrier layers. This can be very useful in case polar materials are used, since the combination of more barrier layers adds several degrees of freedom in the engineering of the polarization charge in the device.

The present invention can be fabricated as an enhancement or depletion mode device. Furthermore, for all the FET structures discussed in this document, the p-channel version can be obtained. Furthermore, the hetero junction based structures can be realized with standard HFET fabrication process. In particular, the S/D regions can be obtained through doping implantations or by partially removing the channel/barrier layer through a selective etch and depositing/growing metallic or semiconductor materials into the created grooves. In this second case the material can be realized with the same material of the channel (or barrier) region and heavily doped in order to decrease the contact resistivity. A metal electrode can be added on the top of the highly doped semiconductor gate region in order to contact the gate of the device. In this case, a very heavily doped layer can be formed at the top of the gate region before depositing the metal contact in order to lower the resistivity of the metal semiconductor contact.

As mentioned above, the materials used in the fabrication process of the previous structures can comprise any type of semiconductor material, including II-VI compound semiconductors, III-V polar (such as GaN, AlN, InN etc. and their alloys) and non polar (such as GaAs, AlAs, InAs etc. and their alloys or non-polar or semi-polar GaN, AlN, InN etc. and their alloys) materials, and/or in some case silicon, germanium, SiGe, sapphire, SiC, etc. In case polar materials are used, both N-face and Ga-face structure can be obtained using simple modification of the structure. Suitable materials for the insulator layer are for example SiN, $Al_2O_3$, $SiO_2$, MgO, $TaSiO_x$, Plasma Oxides, and many others, depending on the semiconductor materials used in the device.

It is therefore an object of the present invention to obtain a device which can operate in normally-off conditions, without presenting strong limitations on the gate bias, with a threshold voltage easily tunable at the desired value and, at the same time, a reduced gate leakage current.

As is clear to those skilled in the art, this basic system can be implemented in many specific ways, and the above descriptions are not meant to designate a specific implementation.

BRIEF DESCRIPTIONS OF THE DRAWINGS

The features, objects, and advantages of the present invention will become apparent upon consideration of the following detailed description of the invention when read in conjunction with the drawings in which.

DETAILED DESCRIPTION OF SPECIFIC EMBODIMENTS

A FIG. 4

Figure 4:
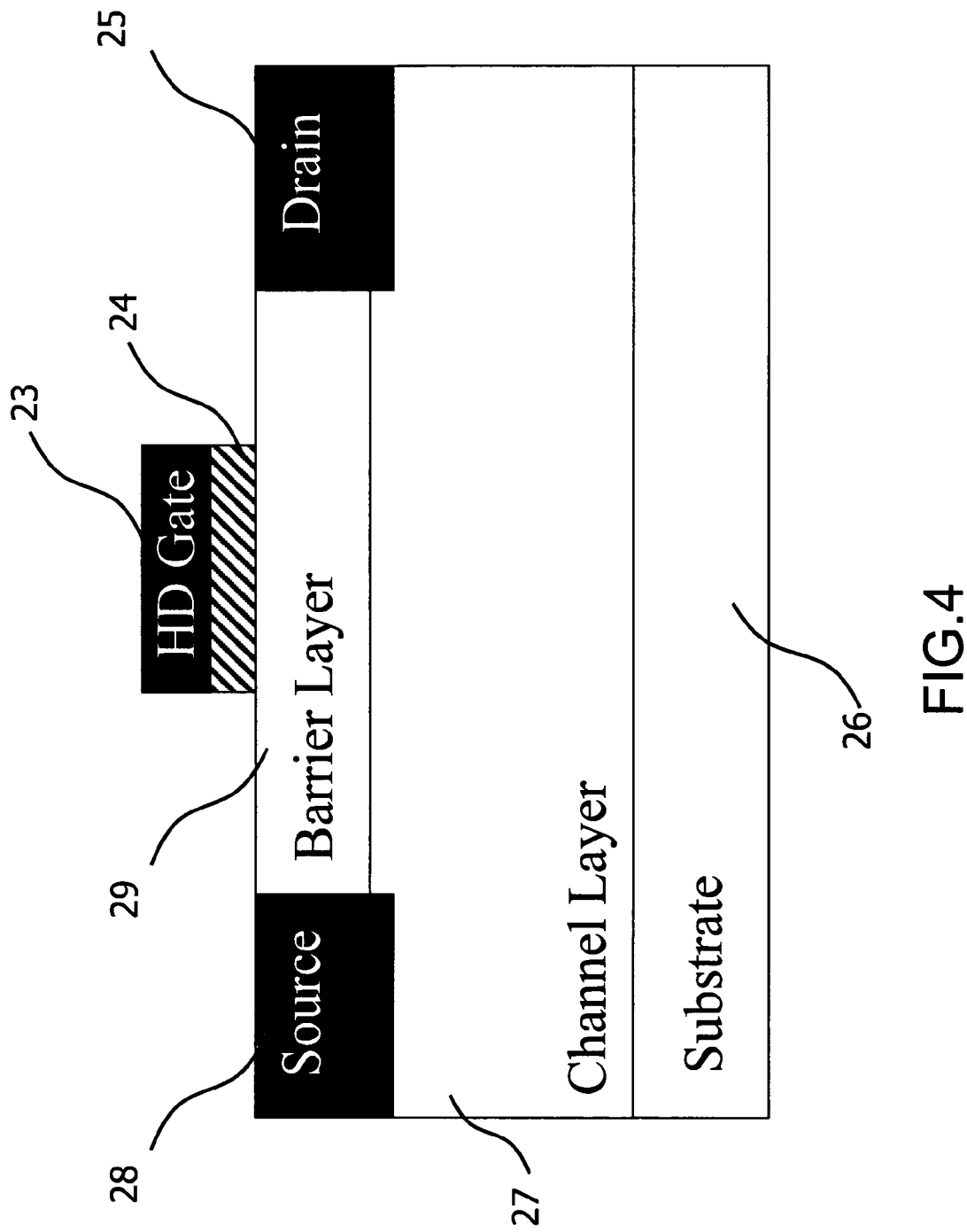
FIG. 4 shows a cross section view of a HFET device according to the preferred embodiment of the invention.

FIG. 4 is showing a Hetero-structure FET (HFET) device according to the preferred embodiment of the invention. The metallic or n+-type semiconductor regions 28 and 25 define the source and the drain of the transistor. Regions 29 corresponds to the barrier layer of the device, and the channel layer 27 is the region where the electron (or hole)—channel is formed. Region 23, which is formed by a heavily doped semiconductor layer on the top of an insulating layer 24, corresponds to the gate of the device.

If the desired device is an n-channel HFET, the channel region should have an electron affinity greater with respect to the barrier layer 29, in order to confine the carrier transport inside the layer 27 during the normal operation of the device. The gate region 23 instead, can be built with the same, greater or lower electron affinity with respect to the barrier layers, depending on the desired device characteristics. If necessary, the gate 23 and/or the barrier layer 29 can be replaced with multi-layer stacks formed by different material layers.

The semiconductor forming the gate layer, which preferably have a crystalline or polycrystalline structure, allows an easy adjustment of the threshold voltage to the desired value. In particular, if an alloy compound semiconductor material is employed, the threshold voltage can be varied by simply changing the molar fraction of the elements composing the compound material, allowing for an extremely wide range of work-function values. This is a great advantage with respect to metal gates, that instead present a limited spectrum of work-functions and/or a series of integration and processing problems.

The insulating layer drastically reduces the gate leakage current and at the same time eliminates the limitations on the doping type and/or material used for the gate region. In the proposed structure, the parasitic diode has been eliminated allowing also the use of n-doped materials for the gate region. This is an important advantage, since in general n-type doping in compound semiconductor is much easier to deal with respect to p-type one. Furthermore, due to the presence of the insulating layer, the choice of the semiconductor material and its thickness are not anymore limited by the need to obtain a lattice matched structure.

Figure 1:
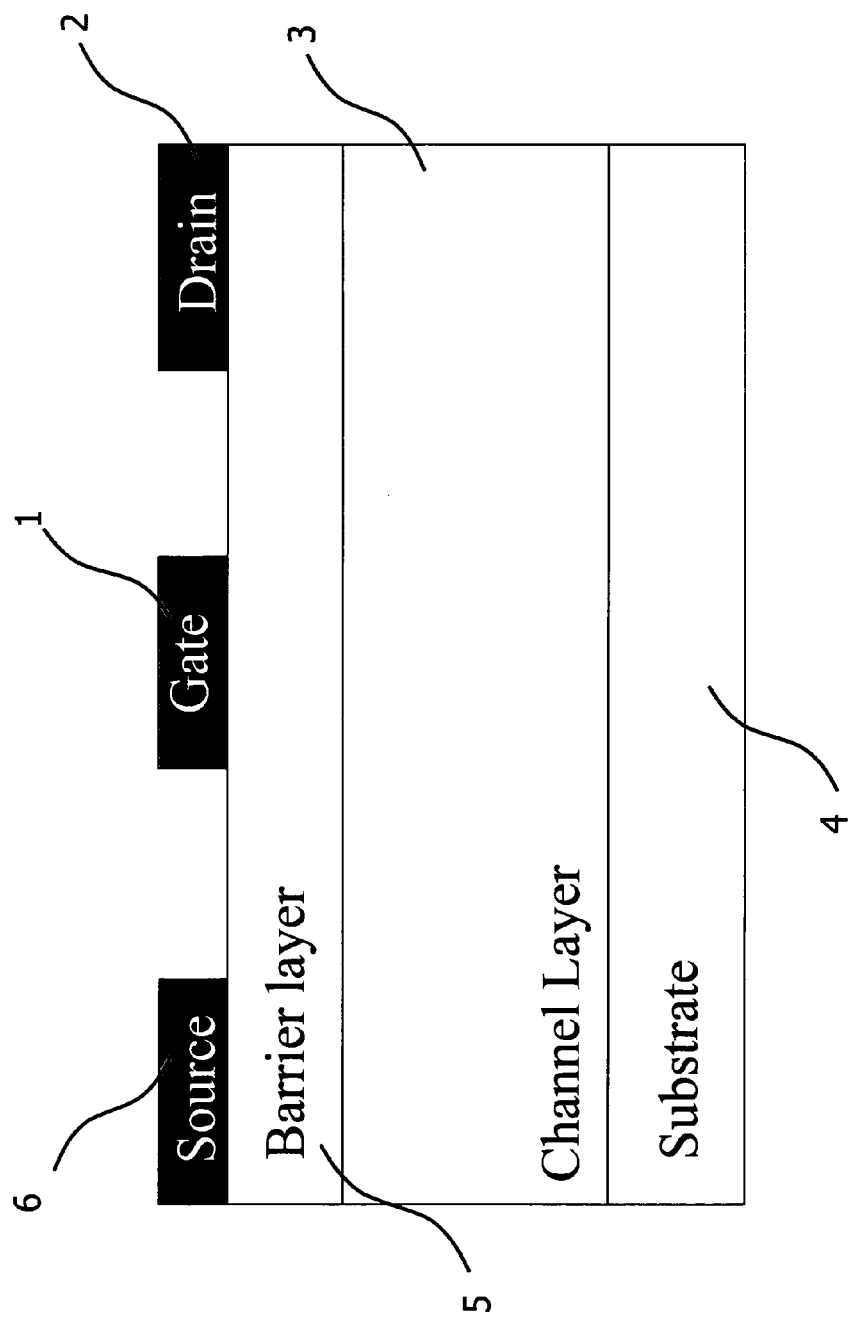
FIG. 1 shows a cross section view of a conventional HFET device (prior art).
Figure 2:
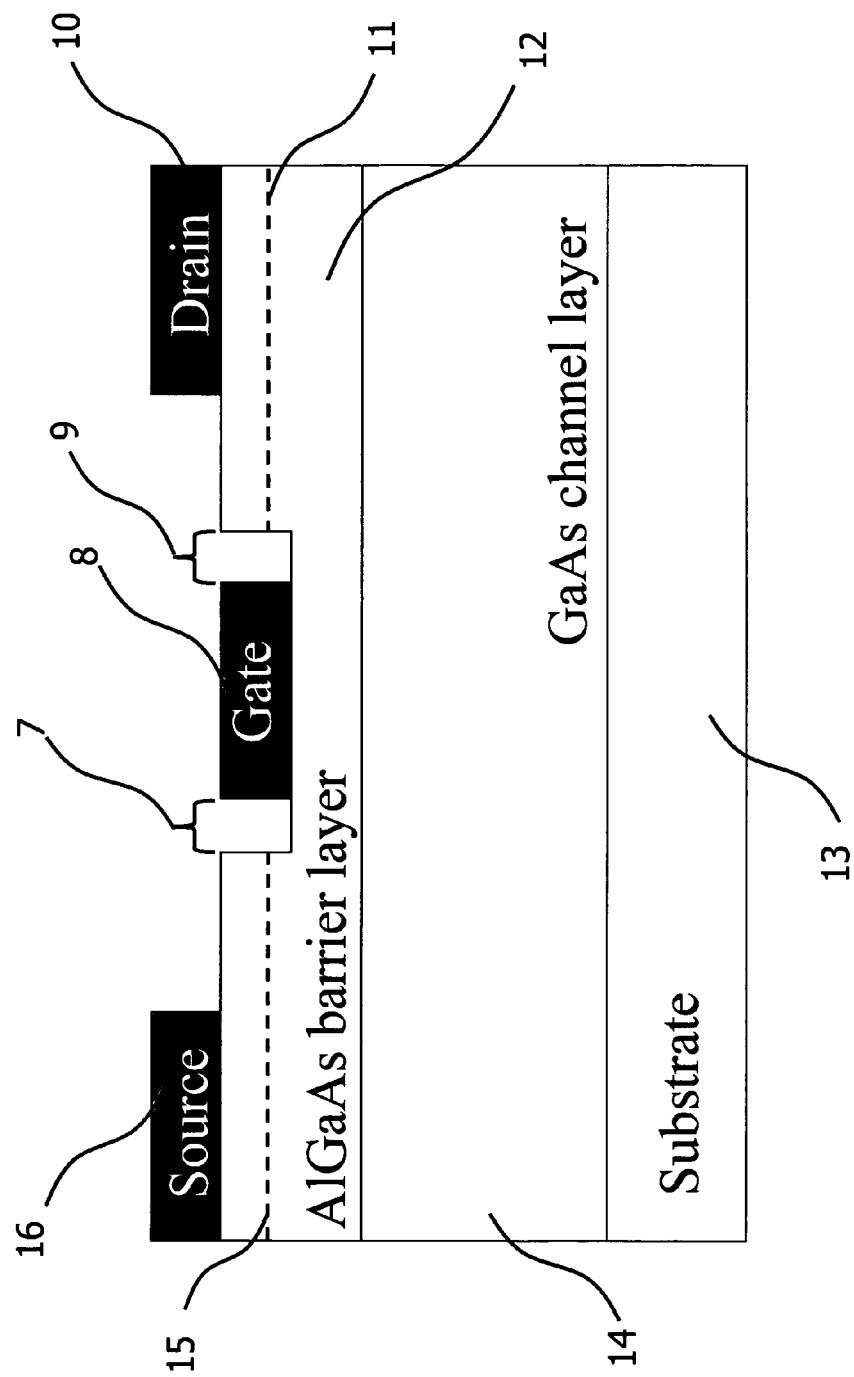
FIG. 2 shows a cross section view of a HFET device in GaAs technology (prior art).
Figure 3:
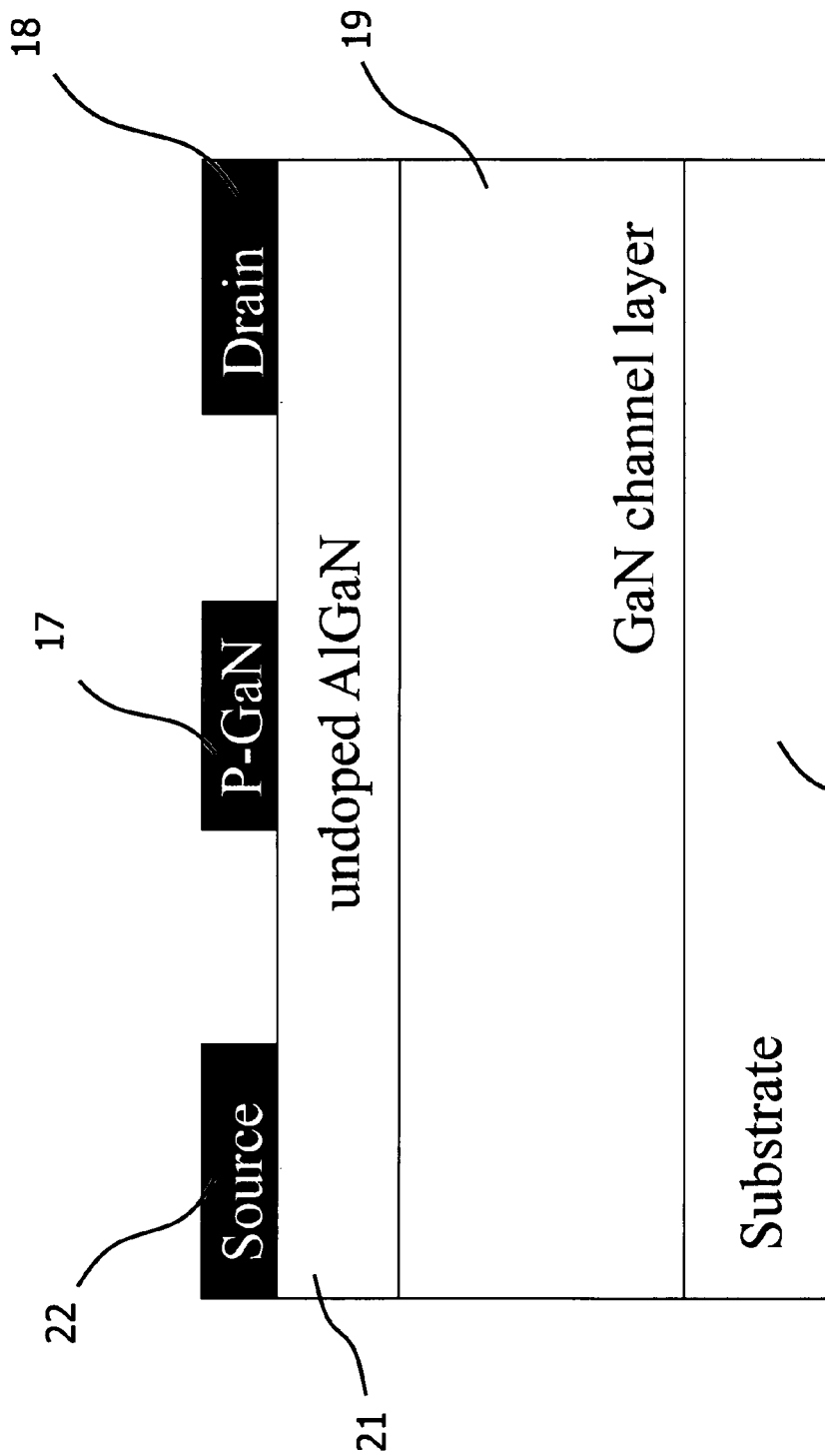
FIG. 3 shows a cross section view of a HFET device in GaN technology (prior art).

The source and drain regions 28 and 25 can be extended down into the channel as shown in FIG. 4 in order to minimize the contact resistance of the device, or they can be limited into (or on top of) the barrier layer. They can be realized in metal or with the same material of the channel (or barrier) region and heavily doped in order to decrease the contact resistivity. The barrier layer and the channel layer can be left un-doped or can be doped with n- or p-type impurities in order to tune the threshold voltage. Furthermore, the gate-insulating stack can be also formed in a recessed region, similarly to what has been done for the metallic gate 8 in FIG. 2, in order to reduce the distance between the gate and the device channel, thereby increasing the device transconductance.

The present invention can be realized both with polar and non-polar (or semi-polar) materials, without requiring delta doping implantations (at least for the enhanced mode version). It can be fabricated as an enhancement or depletion device with much higher control on the device threshold voltage, and with superior RF performance.

Starting from the base concept structure of FIG. 4, an unlimited number of modifications can be adopted depending on the materials used, in order to optimize the device performance. Supply carrier layers and/or barrier layers can be added to the device.

B FIG. 5

Figure 5:
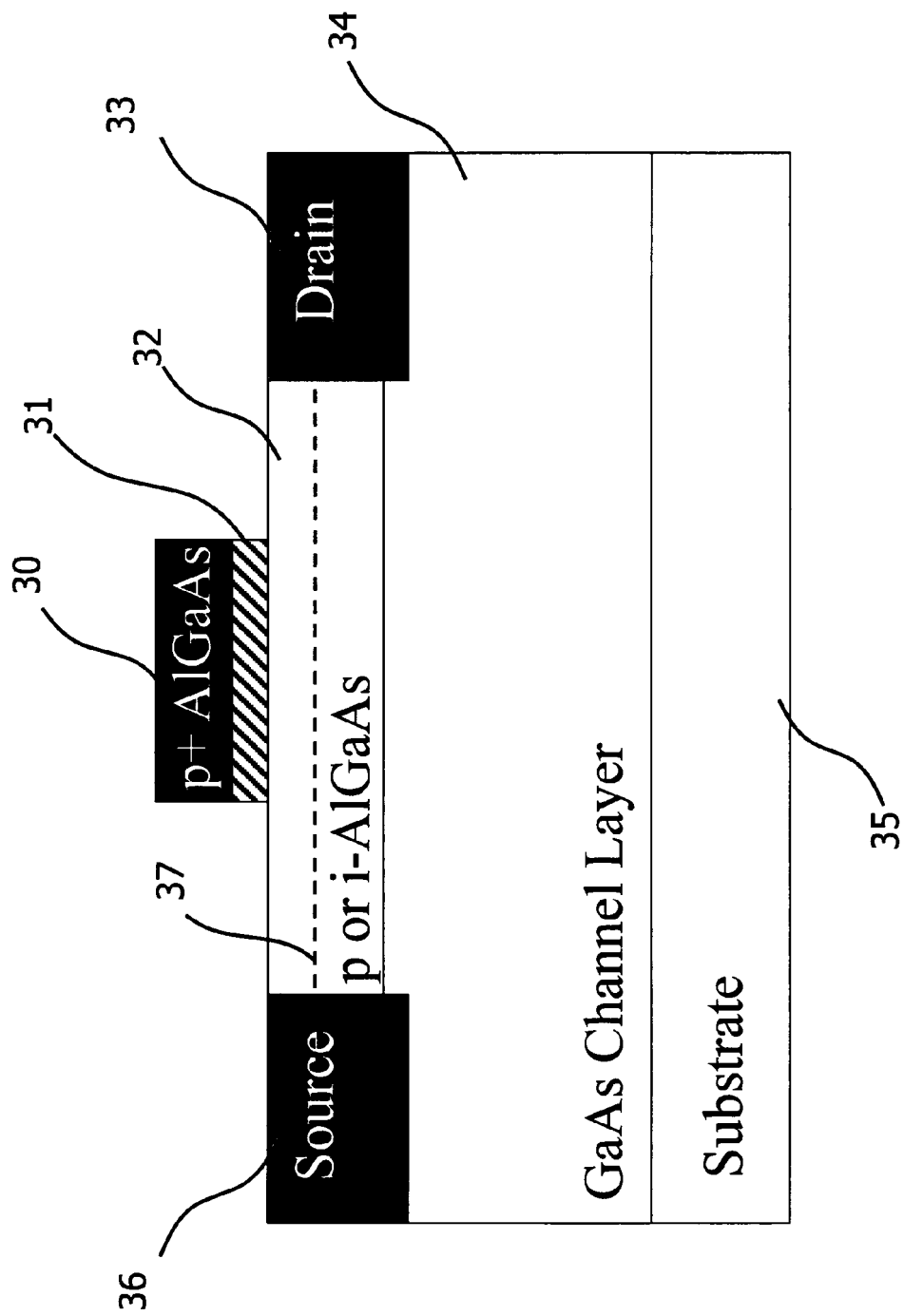
FIG. 5 shows an implementation example of the embodiment of FIG. 5, realized in GaAs technology.

FIG. 5 is depicting a cross-section view of a possible implementation of the embodiment described in FIG. 4, where an AlGaAs barrier 32 and a GaAs channel layer 34 have been used. A δ-doping implant 37 has been introduced into the barrier layer in order to supply carriers to the device channel. A heavily p-doped AlGaAs layer 30 has been used as a gate region in order to obtain an enhancement mode device. As well known to anyone skilled in the art, also GaAs, InGaAs, or InAs can be used in place of AlGaAs for the gate region obtaining similar results. If desired, the gate-insulating stack can be also formed in a recessed region, similarly to what has been done for the metallic gate 8 of FIG. 2, in order to selectively remove the δ-doping under the gate and further rise the threshold voltage of the device.

C FIG. 6

Figure 6:
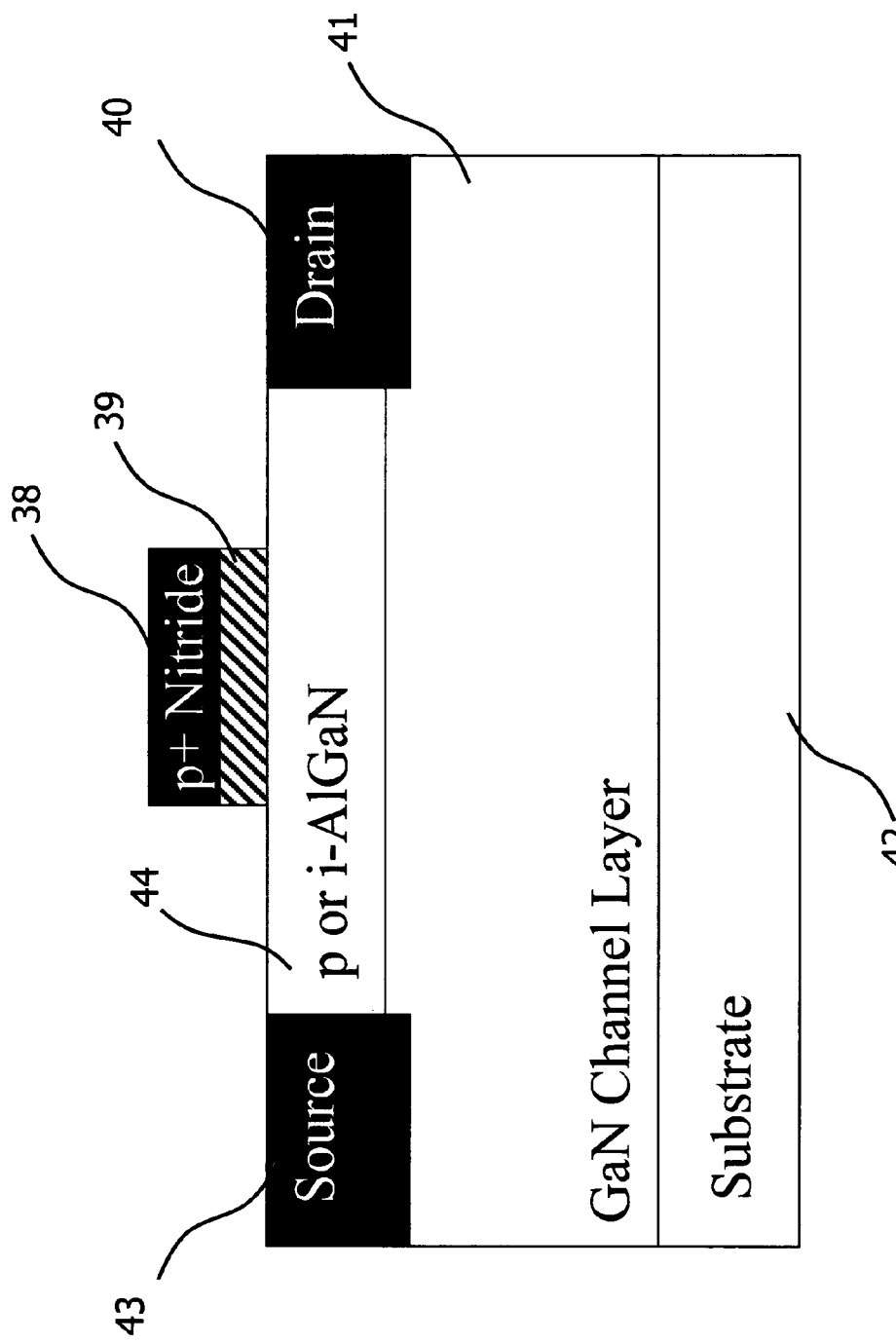
FIG. 6 shows an implementation example of the embodiment of FIG. 5, realized in polar III-Nitride technology with a p-doped gate.

FIG. 6 is depicting a cross-section view of a further implementation of the embodiment of FIG. 5 realized with polar materials. In this structure, the polarization generated at the hetero-interface between the channel layer 41 and the barrier layer 44 is partially (or totally) offset by the polarization generated at the hetero-interface between the barrier layer 44 and the insulating layer 39 summed to the polarization charge eventually generated at the lower interface of the gate region. As a result, the concentration of two-dimensional electron gas (2DEG) below the GaN control layer is selectively reduced. The use of a heavily p-doped gate further lowers the Fermi energy into the channel thereby achieving the normally-off characteristic. The gate region can be fabricated for example with GaN, InN, AN or one of their alloys. The smaller is the band-gap of the material used and the higher is the p-doping activation, lowering the gate resistance of the device.

D FIG. 7

Figure 7:
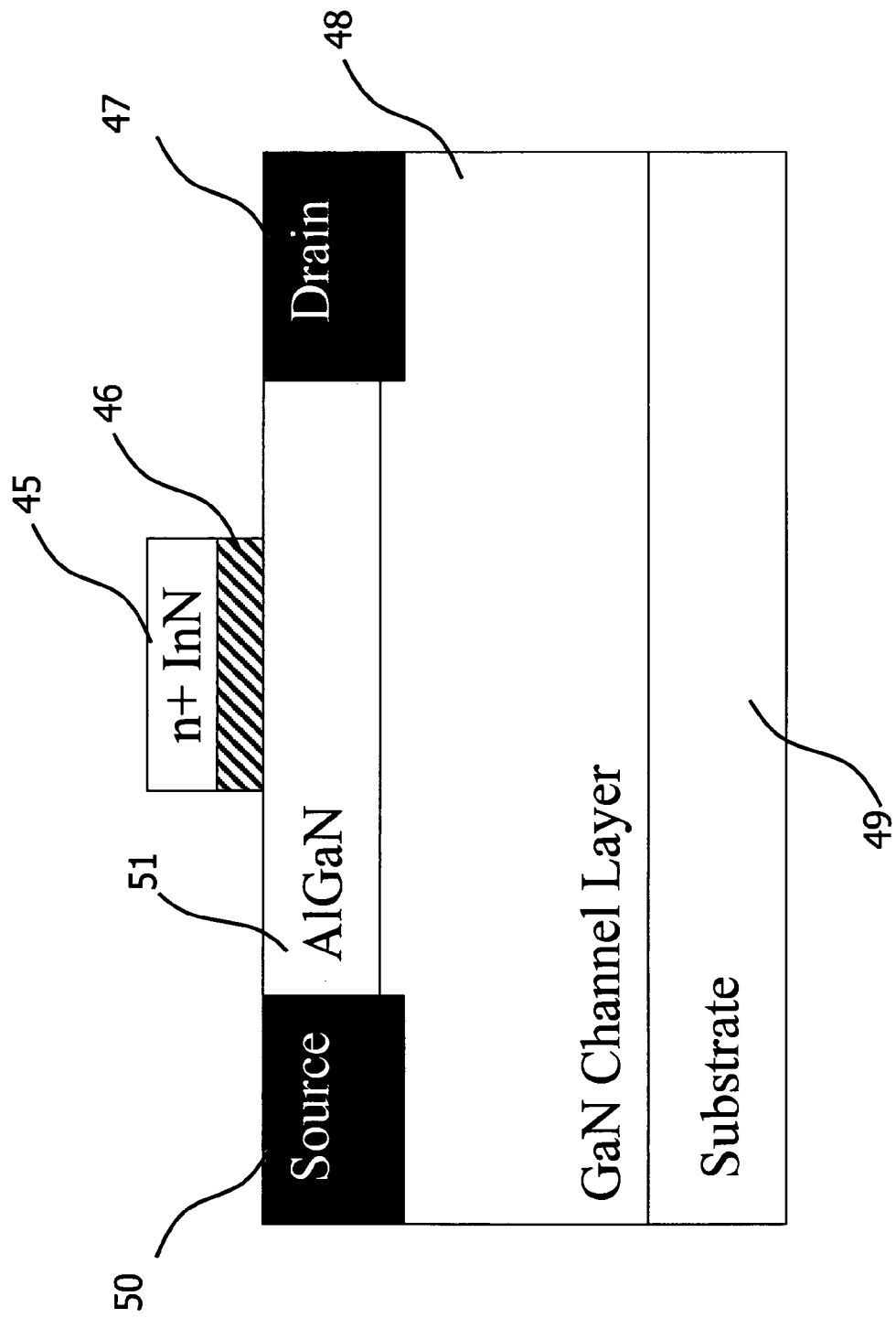
FIG. 7 shows an implementation example of the embodiment of FIG. 5, realized in polar III-Nitride technology with a n-doped gate.

FIG. 7 is depicting another example of implementation of the embodiment of FIG. 5, realized in polar GaN technology. In this structure the gate 47 has been fabricated with a heavily n-doped InN layer. Due to the high electron affinity of this material, the device still behaves as an enhancement mode device even if no p-doped layer is present. Similar results can be also obtained using an InGaN layer. This characteristic is extremely important since the higher activation of n-dopant with respect to p-dopant impurities drastically reduces the gate resistance and increase the device transconductance, improving the overall device performance. Furthermore, as mentioned above, the use of donor-type impurities allows an improvement in the fabrication process.

E FIG. 8

Figure 8:
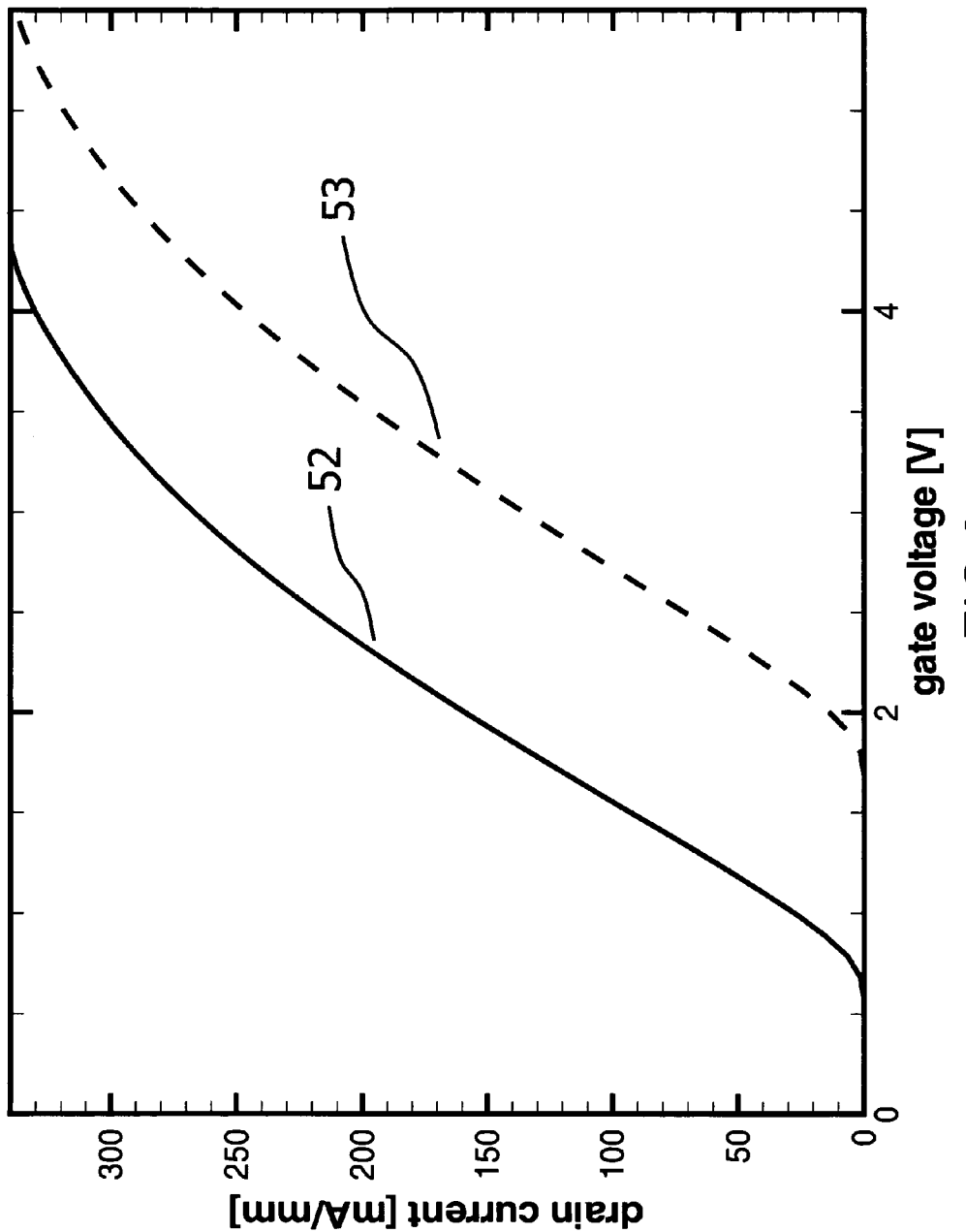
FIG. 8 shows the I-V characteristics resulting by the numerical simulation of the devices according to embodiment of FIG. 6 (dashed lines) and FIG. 7 (solid lines).

In FIG. 8 the I-V characteristics resulting by the numerical simulation of the devices according to embodiment of FIG. 6 (dashed lines 53) and FIG. 7 (solid lines 52) are shown. As it can be seen, both devices have an enhancement behavior. In particular, the embodiment of FIG. 6 with a p+-doped AlGaN gate shows a threshold voltage around 2V, whereas the embodiment of FIG. 7 with the InN n+-doped gate shows a threshold voltage around 0.9V.

F FIG. 9

Figure 9:
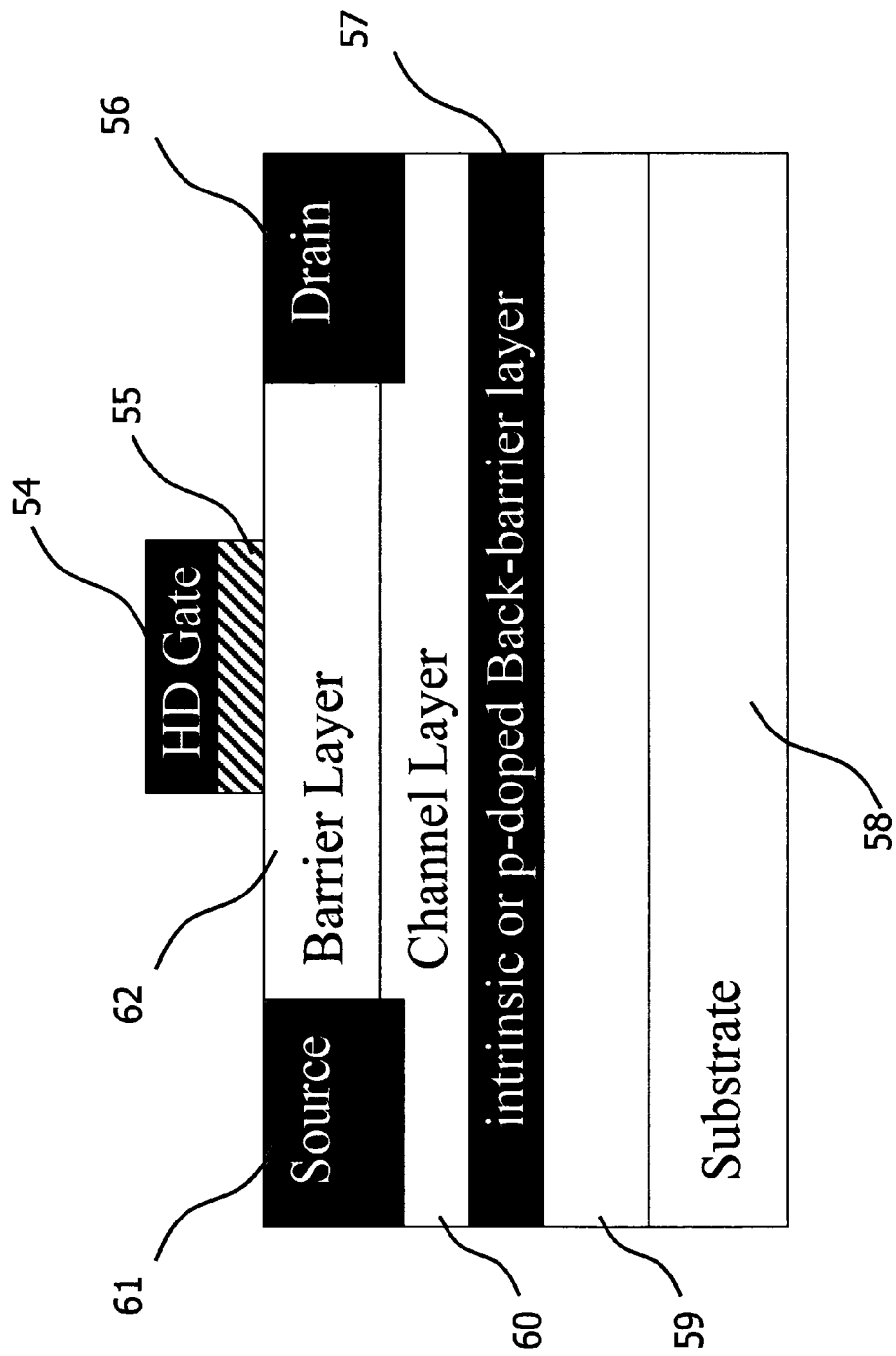
FIG. 9 shows a cross section view of a Hetero-structure device according to a further embodiment of the invention, where a back-barrier layer has been added in order to increase the carrier confinement in the device channel.

In order to minimize short channel effects, such as Drain induce barrier lowering and Punch-through phenomena, a buried back-barrier layer can be added to the structure, so as to effectively improve the carrier confinement in the device channel. This approach is illustrated in FIG. 9, where an extra barrier 57 has been added under the channel 60. The back-barrier layer can be made for example with a semiconductor material having a larger energy-gap with respect to the channel (e.g. AlGaAs or AlAs for a GaAs channel, AlGaN or AlN for a GaN channel) or with a heavily doped layer made of the same material of the channel region. If polar materials are used, a back-barrier layer with a smaller energy-gap with respect to the channel region (such as InGaN for a GaN channel layer) can be also used, exploiting the polarization in the extra layer to confine the carriers into the channel. In general, the back-barrier layer can be left intrinsic or can be doped (also heavily), for example with p-type impurities, in order to increase the carrier confinement into the channel and/or tune the threshold voltage.

G FIG. 10

The back-barrier layer of FIG. 9 can be also replaced with a double back-barrier layer, where a first intrinsic layer (e.g. AlGaN or AlN) is used to increase the back-barrier high, and a second heavily doped layer (e.g. GaN or AlGaN) is used to adjust the threshold voltage of the device.

Figure 10:
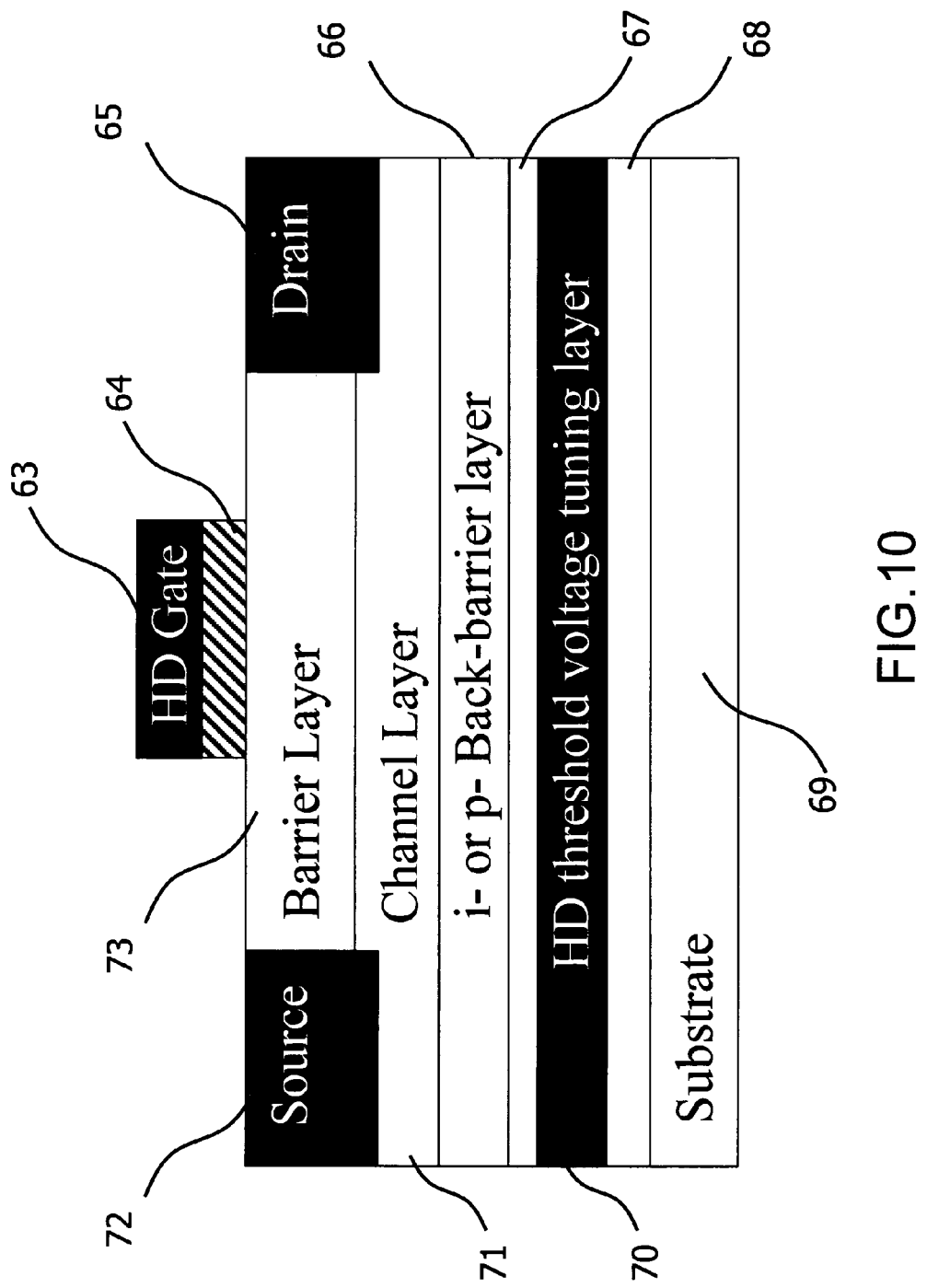
FIG. 10 shows a cross section view of a Hetero-structure device according to a further embodiment of the invention, where a back-barrier layer and a high-doped threshold tuning layer have been added in order to increase the carrier confinement in the device channel and tune its threshold voltage.

A more general approach of this concept is shown in FIG. 10, where a heavily doped threshold tune layer 70 has been added under the back barrier layer 66 in order to tune the threshold voltage of the device at the desired value. As shown in FIG. 10, the extra layer 70 can be spaced from the back-barrier layer 66 in order to reduce the remote impurity scattering in the channel. If desired, the highly doped threshold tuning layer can be also utilized not in combination with a back-barrier layer.

H FIG. 11

Figure 11:
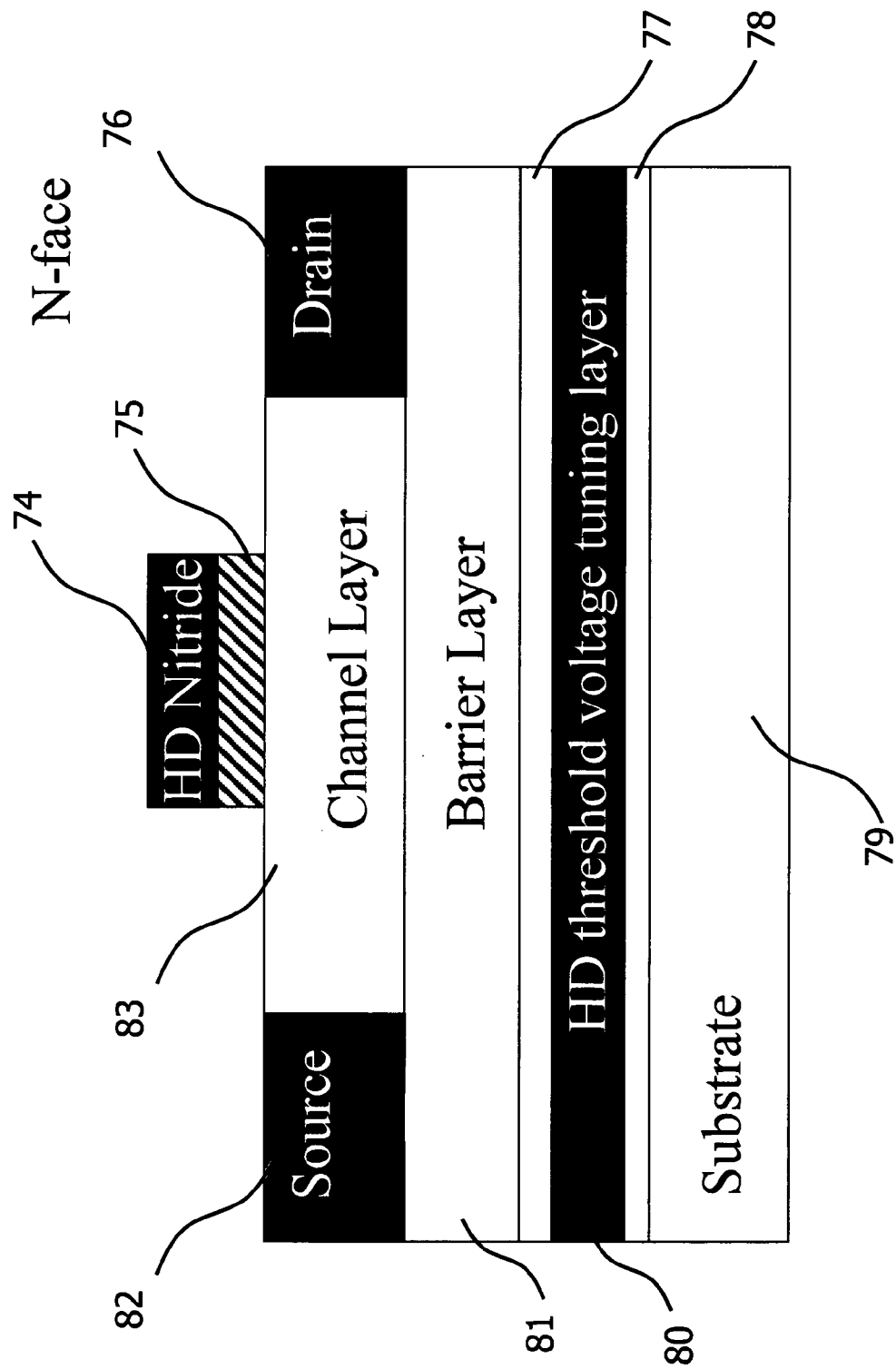
FIG. 11 shows a cross section view of a Hetero-structure device according to a further embodiment of the invention in N-face configuration.

If III-N semiconductor materials are used, the present invention can be realized also with a N-face configuration. In this case the polarization vectors in all material layers are flipped over with respect to the more standard Ga-face configurations discussed above. An example of embodiment in N-face configuration is illustrated in FIG. 11. In this case the electronic channel is formed in the lower part of the channel layer 83, allowing for a natural back-barrier configuration which improves the carriers confinement into the channel layer 83.

I FIG. 12

Figure 12:
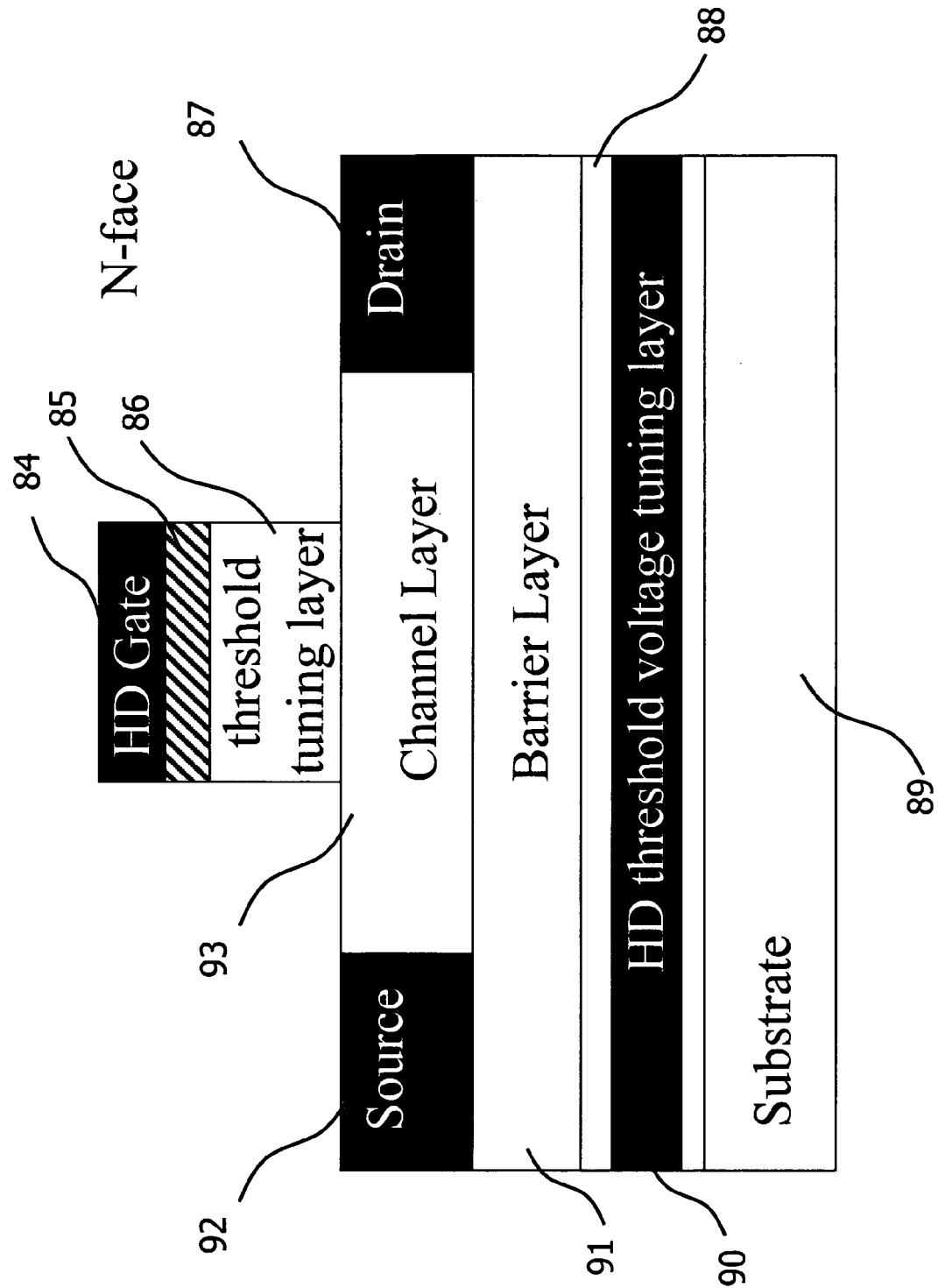
FIG. 12 shows a cross section view of a Hetero-structure device according to a further embodiment of the invention in N-face configuration, where a threshold tuning layer has been added between the insulating layer and the channel layer in order to adjust the threshold voltage to the desired value.

Due to the presence of the heavily doped gate layer 74 and the insulating layer 75, the structure of FIG. 11 can achieve normally-off operation mode without adding any extra layer between the channel 83 and the gate insulating layer 75. If needed however, one or more threshold tuning layers, which can be formed for example by doped or un-doped AN or AlGaN, can be added under the insulating layer as shown in FIG. 12. The negative polarization at the lower interface of the extra layer (and/or its doping) further depletes the channel, thereby increasing the threshold voltage.

J FIG. 13

Figure 13:
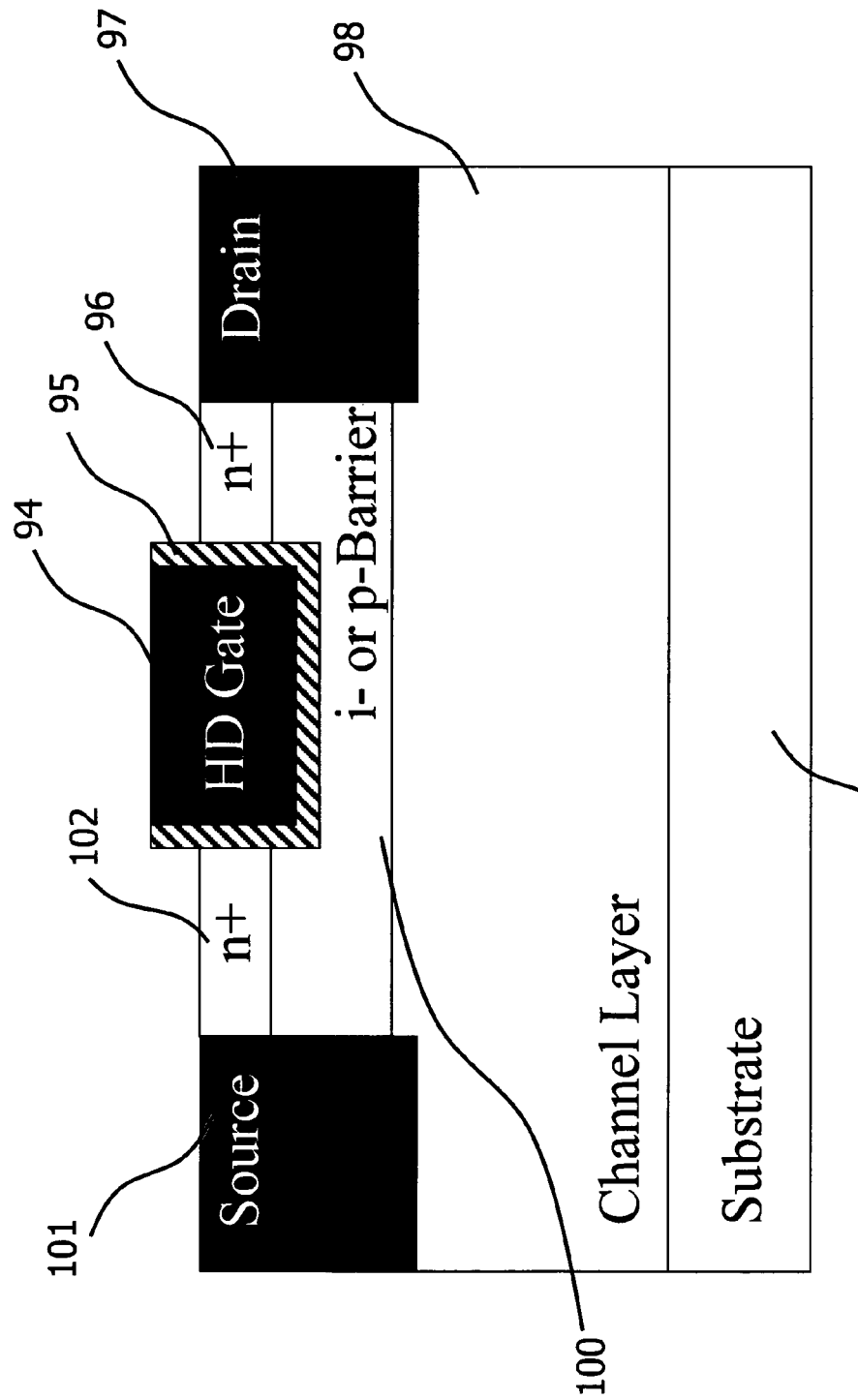
FIG. 13 shows a cross section view of a Hetero-structure device according to a further embodiment of the invention, where two highly doped regions have been added on the top of the barrier layer in the access regions, in order to decrease the access resistance of the device.

Another interesting embodiment of the present invention is shown in FIG. 13, where two highly n-doped regions 102 and 96 have been added on the top of the barrier layer 100 into the access regions. These extra regions partially (or totally) compensate the polarization charge at the upper surface of the barrier 100 increasing the carrier concentration into the channel layer 98, thereby reducing the access resistance of the device.

K FIG. 14

Figure 14:
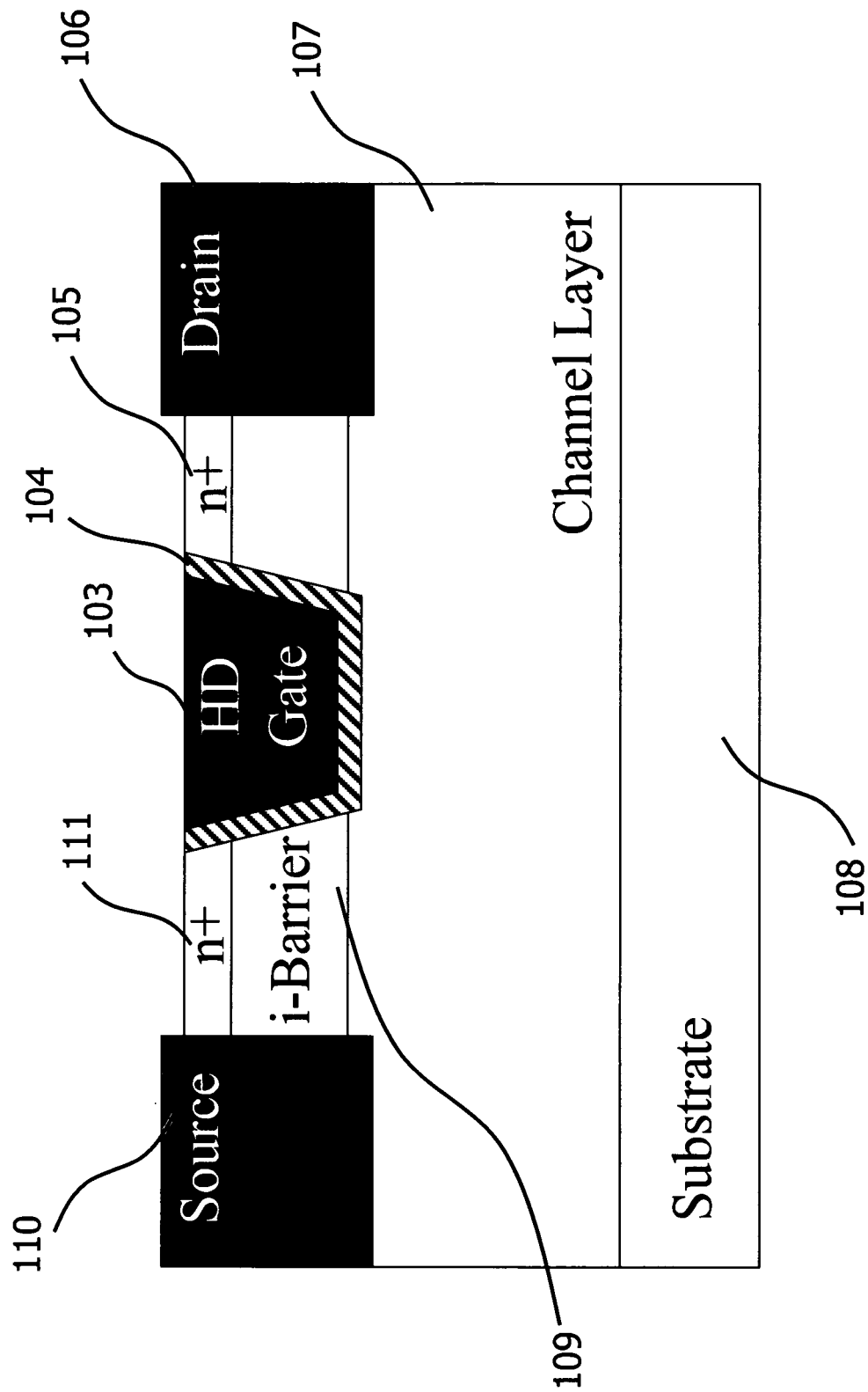
FIG. 14 shows a cross section view of a Hetero-structure device according to a further embodiment of the invention in MOS-HEMT hybrid configuration.

As shown in FIG. 14, the present invention can be applied also in MOS-HEMT hybrid structures where the conduction under the gate is obtained by inverting the conductivity type of the material under the insulating layer 104. Also in this embodiment two highly n-doped regions 105 and 111 are present on the top of the barrier layer.

L FIG. 15

Figure 15:
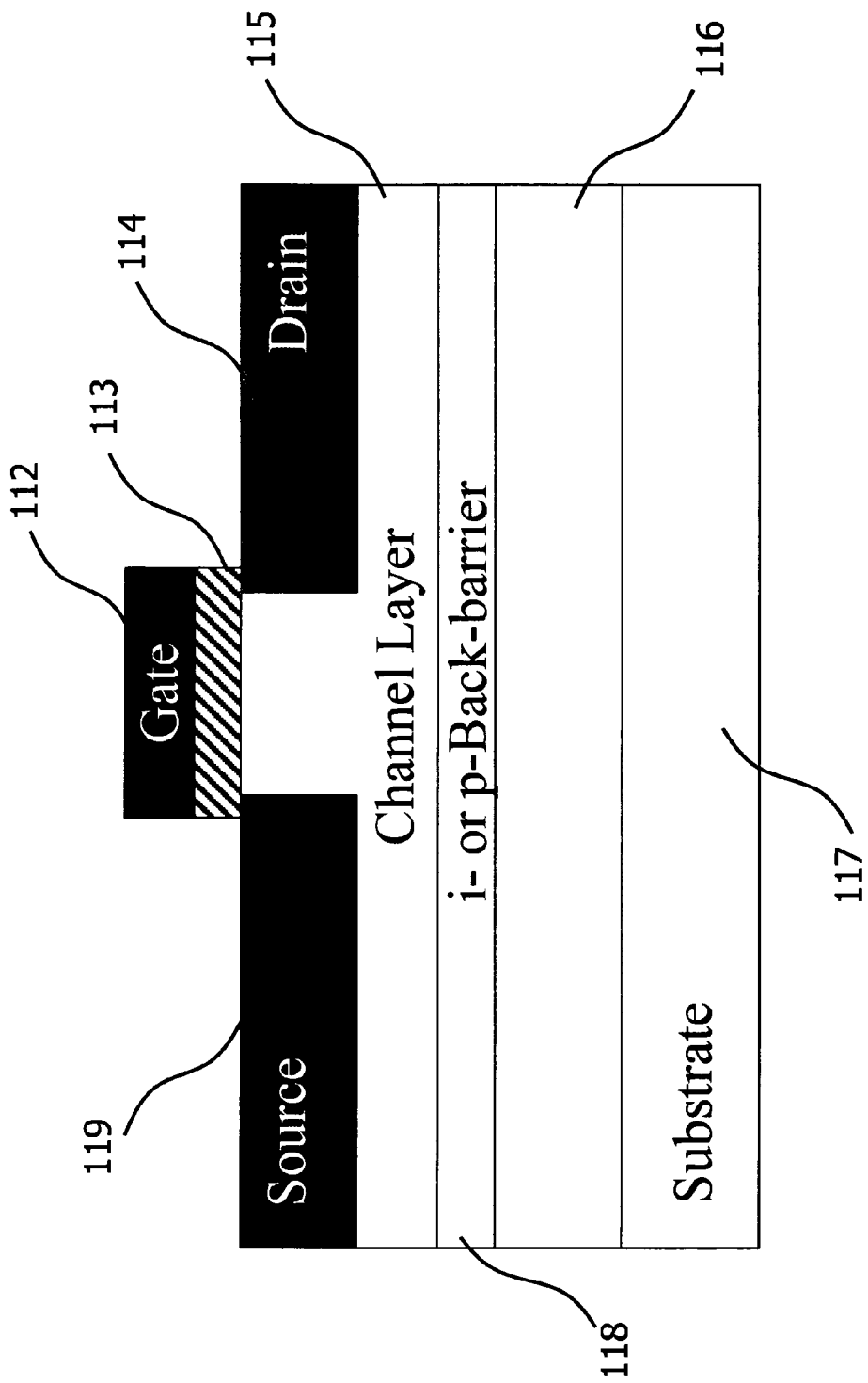
FIG. 15 shows a cross section view of a FET device according to a further embodiment of the invention in MOSFET like configuration.

Similarly, a MOSFET like structure can be obtained as shown in FIG. 15. In this case, a back-barrier layer 118 has been added to increase the carrier confinement into the channel as discussed above. As in all the other structures described in this document, the back-barrier layer is suggested but not essential to the working principle of the device. Furthermore, also in this case the back-barrier layer can be intrinsic or heavily doped, and can be used in combination with a heavily doped threshold tune layer.

M FIG. 16

Figure 16:
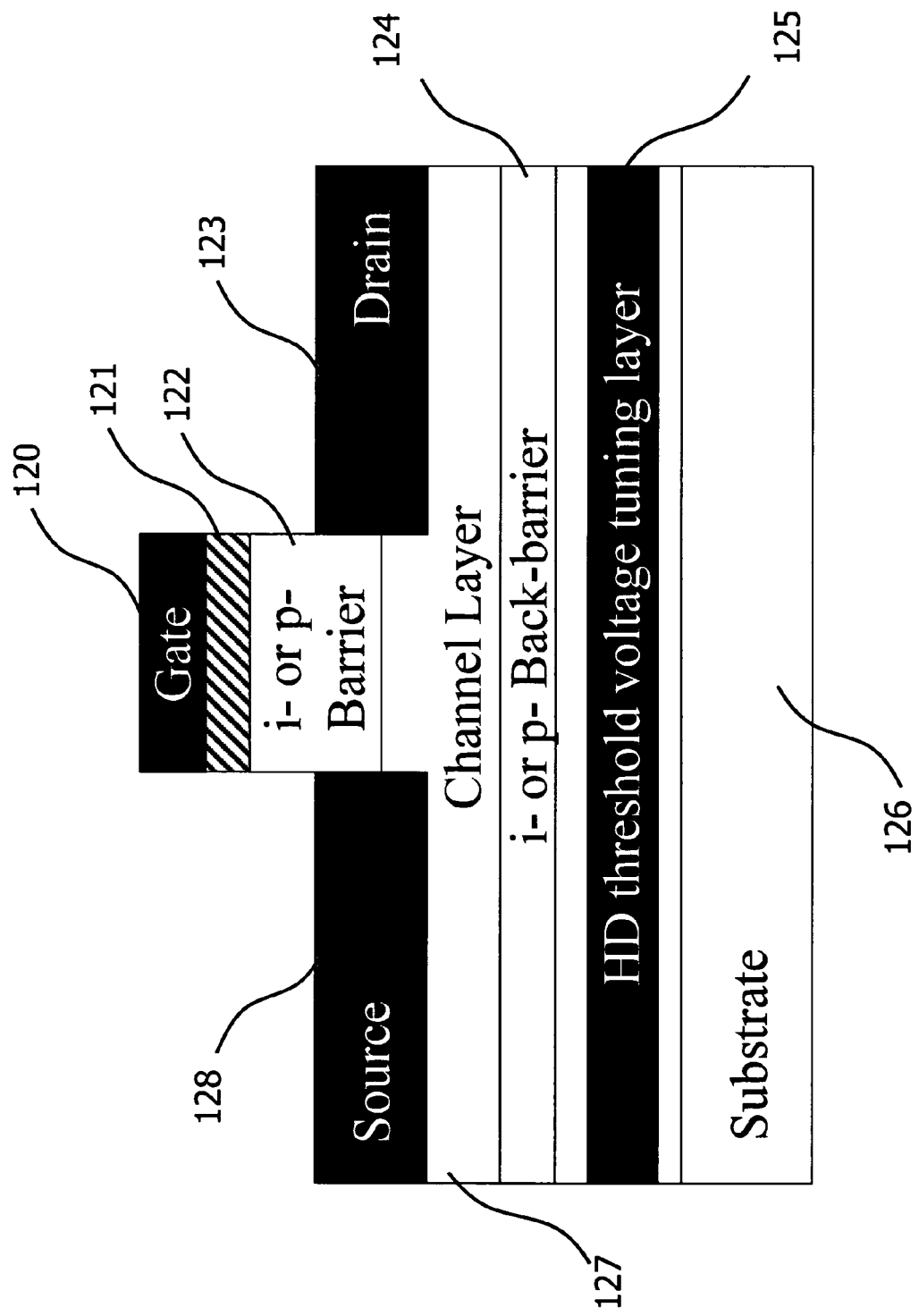
FIG. 16 shows a cross section view of a Hetero-structure device according to a further embodiment of the invention, where the source and drain regions have been self-aligned with the gate region.

Another embodiment of the present invention is shown in FIG. 16. In this case, the drain and source regions 128 and 123 have been self-aligned with the barrier layer. This configuration does not have access regions, thereby the carriers travel directly from/to the source/drain terminal to/from the modulated channel-region under the gate. This characteristic leads to another important consequence, i.e. there is no need to form delta doping implants (at least in an enhanced mode device), or a recessed gate, since the only barrier region left is the one underneath the gate region. Furthermore, the dispersion phenomena are practically eliminated, since trapping and de-trapping phenomena are usually associated to the access regions of the device. Also in this case the back-barrier layer 124 is suggested but not essential to the working principle of the device. The back-barrier layer can be intrinsic or doped (also heavily if desired), and can be used in combination with a heavily doped threshold tune layer 125.

One lightly n-doped region can be also added at the edge of the drain region in order to minimize the electric field in the device. In this case the lightly doped region operates as drift-region for the HFET device.

Due to the peculiar structure of the device, the barrier layer 122 and the insulating layer 121 can be made wider than the gate region 120 so as to partially overlap the source and drain regions 128 and 123 or can be self-aligned with the gate region 120, so as to reduce the number of process masks required in the device fabrication process. The back-barrier layer and the heavily doped threshold tuning layer are suggested but not essential to the working principle of the device.

The barrier layer 122 can be also replaced with a stack of different layers of different materials (and/or doped with different impurity types or concentrations) in order to improve the device performance. Another possibility is to use different molar fraction for the different barrier layers.

In the last two embodiments, since the device does not present access regions, the use of a heavily doped layer as (or in combination with) a back barrier presents many advantages. Aside from increasing the carrier confinement into the channel, this extra layer allows adjusting the threshold voltage of the device at the desired value regardless of the structure chosen for the device gate (schottky metal gate, metal/insulator stack gate, highly doped semiconductor gate or highly doped insulated gate).

With this technique, an enhancement mode device can be obtained also utilizing for example a Schottky gate or an insulated metal gate. Differently from the case where a highly doped layer is used as a gate region (insulated or not), the resistivity of this extra layer does not influence the device performance completely overcoming the issues related to the use of p-dopants in III-V materials in order to obtain enhancement mode devices.

N FIG. 17

Figure 17:
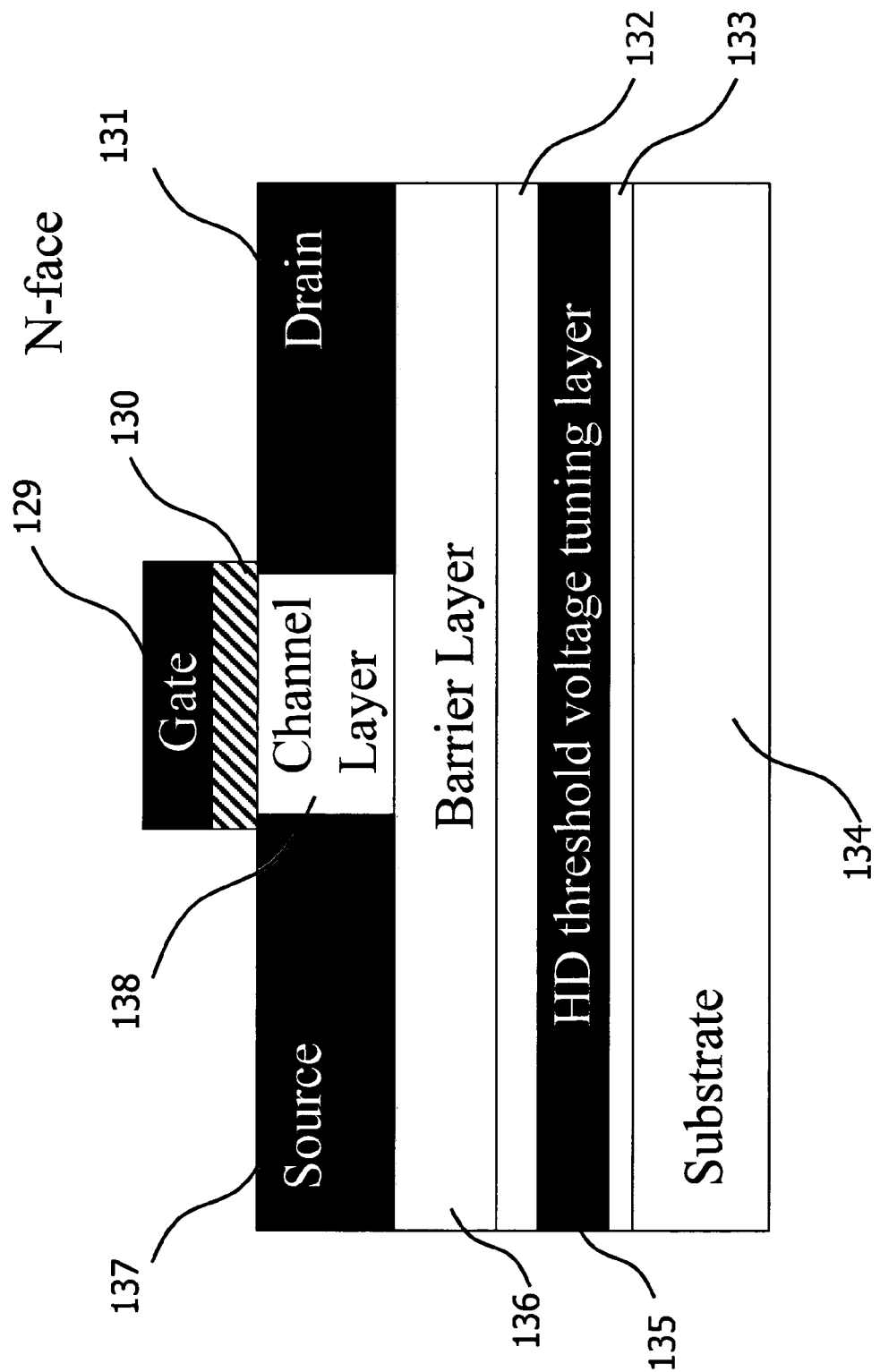
FIG. 17 shows a cross section view of a Hetero-structure device according to a further embodiment of the invention in N-face configuration, where the source and drain regions have been self-aligned with the gate region.

Starting from the previous embodiment, as in all the device configurations described in this document, an N-face configuration can be obtained as depicted in FIG. 17. In this embodiment a second channel can form at the upper interface of the channel layer 138 allowing an increase of the device performance. Also in this structure, as in the embodiment of FIG. 12, one or more a threshold tuning layer can be added between the insulating layer 130 and the channel 138 in order to increase the threshold voltage of the device. The back-barrier layer is suggested but not essential to the working principle of the device. Furthermore, the back-barrier layer can be intrinsic or heavily doped, and/or can be used in combination with a heavily doped threshold tuning layer. Also in this case, the use of a heavily doped layer as (or in combination with the) back-barrier layer allows the fabrication of enhancement mode devices regardless of the structure utilized for the gate of the device.

O FIG. 18

Figure 18:
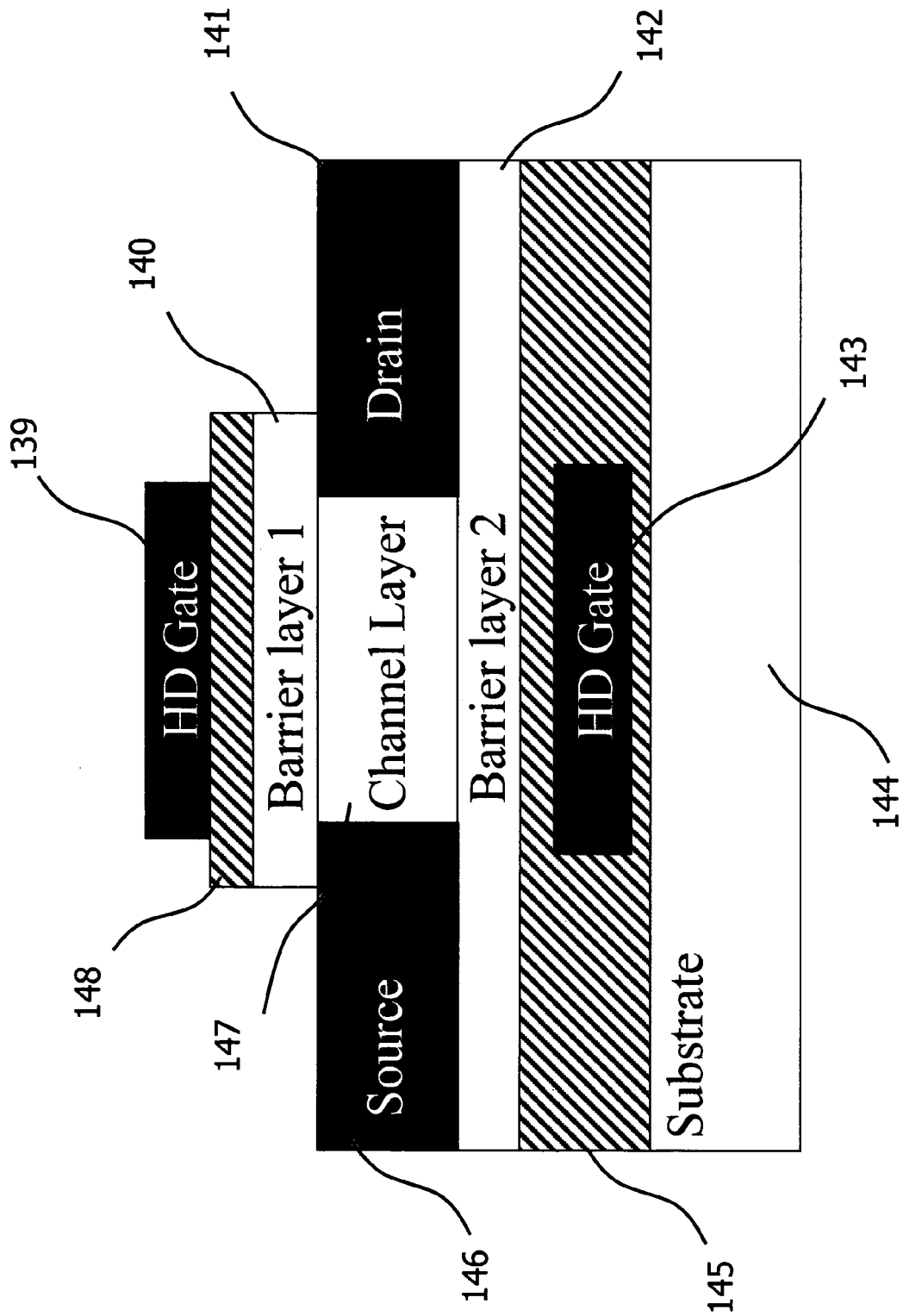
FIG. 18 shows a cross section view of a double gate Hetero-structure device according to a further embodiment of the invention.
Figure 19:
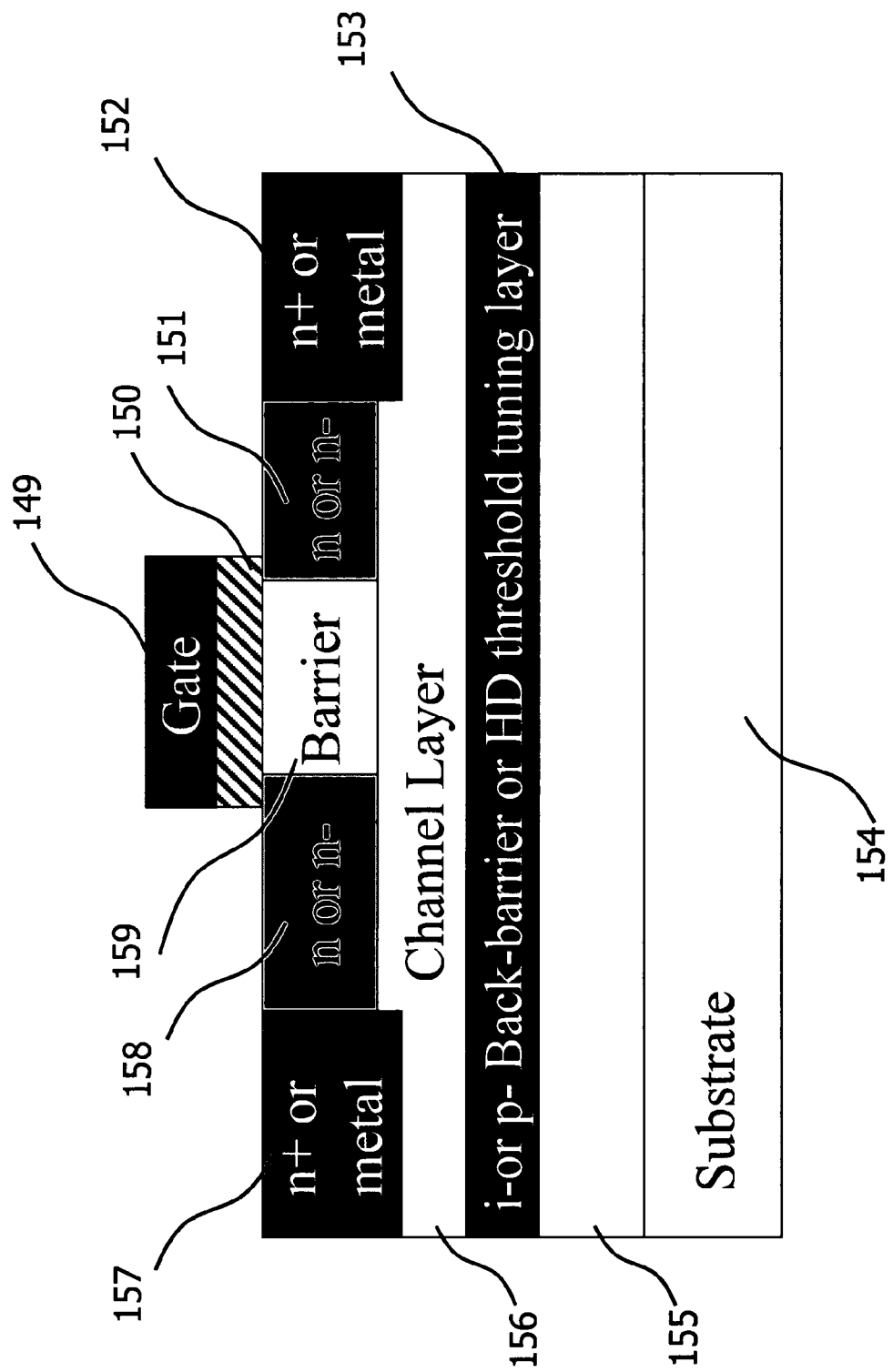
FIG. 19 shows a cross section view of a Hetero-structure device according to a further embodiment of the invention, where two lightly doped regions 151 and 158 have been added to the device.

As shown in FIG. 18, the present invention can be also fabricated with a multi-gate configuration, where an extra gate 143 has been added under the buried barrier layer 142 in order to improve the device performance. The two gates can be coupled together or biased differently, one from the other, depending on the application. Many other multi-gate configurations can be obtained starting from the basic concept illustrated in FIG. 18. If the channel region 147 is formed thin enough, the two channels at the upper and lower interface can also merge in a single electron (or hole)—channel, further increasing the control on the carrier transport. The $R_{DSon}$ of the device is much lower due to the enhanced current drive derived from the double channel configuration. Furthermore, if necessary, one or both gate layers 139 and 143 (and/or one or both the barrier layers 140 and 142) can be divided in more layers of different materials and/or different doping in order to improve the device performance.

As known to anyone skilled in the art, many doping profiles and layers can be added to the structures described above in order to improve the device design and the channel density. Other techniques include the use of $\delta$ doping implants and many other variants.

For all the FET structures discussed above, the p-channel version can be obtained. Furthermore, the hetero junction based structures can be realized with standard HFET fabrication process. In particular, the S/D regions can be fabricated with n+ semiconductor or metallic materials. These regions can be obtained through an implantation process step or by etching the barrier layer and sub-sequentially depositing/growing metal or semiconductor in the grooves created. In this second case, the source and drain regions can be realized also with the same material of the channel region in order to decrease the contact resistance. A metal electrode can be added on the top of the high doped semiconductor gate region in order to contact the gate of the device. In this case, a very heavily doped layer can be formed at the top of the gate region before depositing the metal contact in order to lower the resistivity of the metal semiconductor contact.

As mentioned above, the materials used in the fabrication process of the previous structures can comprise any type of semiconductor material, including II-VI compound semiconductors, III-V polar (such as GaN, AlN, InN etc. and their alloys) and non polar (such as GaAs, AlAs, InAs etc. and their alloys or non-polar or semi-polar GaN, AlN, InN etc. and their alloys) materials, and/or in some case silicon, germanium, SiGe, sapphire, SiC, etc. In case polar materials are used, both N-face and Ga-face structure can be obtained using simple modification of the structure.

Although the present invention has been described above with particularity, this was merely to teach one of ordinary skill in the art how to make and use the invention. Many additional modifications will fall within the scope of the invention. Thus, the scope of the invention is defined by the claims which immediately follow.

What is claimed is:

1. A semiconductor field effect transistor comprising:
   at least one compound semiconductor layer, formed with at least one of the semiconductor materials belonging to the group comprising III-V and II-VI compounds semiconductors;
   at least one dielectric layer formed above at least a portion of at least one of said at least one compound semiconductor layer;
   at least one semiconductor gate region formed above at least a portion of at least one of said at least one dielectric layer;
   a source region and drain region;
   wherein said semiconductor field effect transistor is an hetero-structure field effect transistor;
   wherein said semiconductor gate region is a compound semiconductor region, formed with at least one of the semiconductor materials belonging to the group comprising III-V and II-VI compound semiconductors;
   wherein said semiconductor field effect transistor is an enhancement mode device;
   wherein at least a portion of at least one of said at least one semiconductor gate region is in physical contact with at least a portion of said at least one dielectric layer;
   wherein at least one of said at least one semiconductor gate region is heavily doped, and
   wherein, when said semiconductor field effect transistor is a n-channel device and said semiconductor gate region is not at least partially overlapped with at least a portion of at least one of said source and drain regions, said semiconductor gate region is doped with n-type impurities.

2. The semiconductor field effect transistor of claim 1, further comprising a carrier transport layer;
   wherein at least one of said at least one compound semiconductor layer is a barrier layer;
   wherein said barrier layer is formed above at least a portion of said carrier transport layer, and
   whereby a conductive channel is formed in said carrier transport layer when said semiconductor field effect transistor is turned on.

3. The semiconductor field effect transistor of claim 1, wherein at least one of said at least one compound semiconductor layer is a carrier transport layer, and
   whereby a conductive channel is formed in said carrier transport layer when said semiconductor field effect transistor is turned on.

4. The semiconductor field effect transistor of claim 1, wherein at least one of said at least one semiconductor gate region is formed with at least one of the semiconductor materials belonging to the group comprising III-V and II-VI compounds semiconductors.

5. The semiconductor field effect transistor of claim 1, further comprising at least one back-barrier layer;
   wherein at least one of said at least one compound semiconductor layer is a carrier transport layer;
   wherein said back-barrier layer is formed under said carrier transport layer, and
   whereby a conductive channel is formed in said carrier transport layer when said semiconductor field effect transistor is turned on.

6. The semiconductor field effect transistor of claim 1, further comprising at least one heavily doped threshold voltage tuning layer.

7. The semiconductor field effect transistor of claim 1, wherein said gate region is at least partially overlapped with at least a portion of at least one of said source and drain regions.

8. The semiconductor field effect transistor of claim 1, wherein at least one of said source and drain regions comprises a lightly doped region and a highly conductive region.

9. The semiconductor field effect transistor of claim 1 further including an N-face configuration comprising at least one compound barrier layer under at least one of said at least one compound semiconductor layer.

10. The semiconductor field effect transistor of claim 1, further comprising
    a carrier transport layer;
    at least one highly doped region above at least a portion of at least one of said at least one compound semiconductor layer;
    wherein at least one of said at least one compound semiconductor layer is a barrier layer;
    wherein said barrier layer is formed above at least a portion of said carrier transport layer.

11. A method for manufacturing a semiconductor field effect transistor comprising:
    forming at least one compound semiconductor layer, with at least one of the semiconductor materials belonging to the group comprising III-V and II-VI compounds semiconductors;
    forming at least one dielectric layer above at least a portion of at least one of said at least one compound semiconductor layer;
    forming at least one semiconductor gate region above at least a portion of at least one of said at least one dielectric layer, and
    forming a source and a drain region;
    wherein said semiconductor field effect transistor is an hetero-structure field effect transistor;

wherein said semiconductor gate region is a compound semiconductor region, formed with at least one of the semiconductor materials belonging to the group comprising III-V and II-VI compound semiconductors;

wherein said semiconductor field effect transistor is an enhancement mode device;

wherein at least a portion of at least one of said at least one semiconductor gate region is in physical contact with at least a portion of said at least one dielectric layer;

wherein at least one of said at least one semiconductor gate region is heavily doped, and wherein, when said semiconductor field effect transistor is a n-channel device and none of said source and drain regions is self-aligned with said semiconductor gate region, said semiconductor gate region is doped with n-type impurities.

12. The method of claim 11, wherein said semiconductor field effect transistor comprises at least one back-barrier layer;

wherein at least one of said at least one compound semiconductor layer is a carrier transport layer;

wherein said back-barrier layer is formed under said carrier transport layer, and whereby a conductive channel is formed in said carrier transport layer when said semiconductor field effect transistor is turned on.

13. The method of claim 11, wherein said semiconductor field effect transistor comprises at least one heavily doped threshold voltage tuning layer.

14. The method of claim 11, wherein at least one of said source and drain regions is formed self-aligned with at least one of said at least one semiconductor gate region.

15. The method of claim 11, further comprising forming at least one compound barrier layer under at least one of said at least one compound semiconductor layer;

wherein said semiconductor field effect transistor has a N-face configuration.

16. A semiconductor field effect transistor comprising:

at least one compound semiconductor layer, formed with at least one of the semiconductor materials belonging to the group comprising III-V and II-VI compounds semiconductors;

at least one gate region;

a source and a drain region, and at least one heavily doped threshold voltage tuning layer;

wherein, when said semiconductor field effect transistor is a n-channel device, said doped threshold voltage tuning layer is doped with p-type impurities;

wherein, when said semiconductor field effect transistor is a p-channel device, said doped threshold voltage tuning layer is doped with n-type impurities, and wherein said semiconductor field effect transistor is an enhancement mode device.

17. The semiconductor field effect transistor of claim 16, further comprising at least one back-barrier layer;

wherein at least one of said at least one compound semiconductor layer is a carrier transport layer;

wherein said back-barrier layer is formed under said carrier transport layer, and whereby a conductive channel is formed in said carrier transport layer when said semiconductor field effect transistor is turned on.

18. The semiconductor field effect transistor of claim 16, wherein at least one of said source and drain regions is at least partially overlapped with at least a portion of at least one of said at least one gate region.

19. The semiconductor field effect transistor of claim 16, further comprising at least a dielectric layer between said compound semiconductor layer and said gate region, wherein at least one of said at least one gate region is a highly conductive region.

20. The semiconductor field effect transistor of claim 16 further including an N-face configuration comprising at least one compound barrier layer under at least one of said at least one compound semiconductor layer.

* * * * *